(12) United States Patent
Lin et al.

(10) Patent No.: US 11,895,836 B2
(45) Date of Patent: Feb. 6, 2024

(54) ANTI-DISHING STRUCTURE FOR EMBEDDED MEMORY

(71) Applicant: Taiwan Semiconductor Manufacturing Co., Ltd., Hsinchu (TW)

(72) Inventors: Meng-Han Lin, Hsinchu (TW); Chih-Ren Hsieh, Changhua (TW); Chen-Chin Liu, Hsinchu (TW); Chih-Pin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/022,390

(22) Filed: Sep. 16, 2020

(65) Prior Publication Data

US 2020/0411534 A1    Dec. 31, 2020

Related U.S. Application Data

(62) Division of application No. 16/169,156, filed on Oct. 24, 2018, now Pat. No. 10,804,281.

(Continued)

(51) Int. Cl.
*H10B 41/10* (2023.01)
*H10B 41/50* (2023.01)
(Continued)

(52) U.S. Cl.
CPC ........ *H10B 41/50* (2023.02); *H01L 21/0337* (2013.01); *H01L 21/3086* (2013.01);
(Continued)

(58) Field of Classification Search
None
See application file for complete search history.

(56) References Cited

U.S. PATENT DOCUMENTS 7,307,002 B2    12/2007    Kim et al.
8,076,191 B2    12/2011    Yamakoshi et al.
(Continued)

FOREIGN PATENT DOCUMENTS

CN         105513954 A      4/2016

OTHER PUBLICATIONS

Non-Final Office Action dated Feb. 20, 2020 for U.S. Appl. No. 16/169,156.

(Continued)

*Primary Examiner* — Moin M Rahman
(74) *Attorney, Agent, or Firm* — Eschweiler & Potashnik, LLC

(57) ABSTRACT

Some embodiments of the present application are directed towards an integrated circuit (IC). The integrated circuit includes a semiconductor substrate having a peripheral region and a memory cell region separated by an isolation structure. The isolation structure extends into a top surface of the semiconductor substrate and comprises dielectric material. A logic device is arranged on the peripheral region. A memory device is arranged on the memory region. The memory device includes a gate electrode and a memory hardmask over the gate electrode. An anti-dishing structure is disposed on the isolation structure. An upper surface of the anti-dishing structure and an upper surface of the memory hardmask have equal heights as measured from the top surface of the semiconductor substrate.

20 Claims, 22 Drawing Sheets

Related U.S. Application Data

(60) Provisional application No. 62/738,033, filed on Sep. 28, 2018.

(51) Int. Cl.
*H01L 29/423* (2006.01)
*H01L 29/51* (2006.01)
*H01L 21/033* (2006.01)
*H01L 21/321* (2006.01)
*H01L 21/308* (2006.01)
*H01L 21/28* (2006.01)
*H10B 41/41* (2023.01)
*H10B 43/35* (2023.01)
*H10B 43/40* (2023.01)
*H10B 43/50* (2023.01)

(52) U.S. Cl.
CPC .... *H01L 21/3212* (2013.01); *H01L 29/40117* (2019.08); *H01L 29/42328* (2013.01); *H01L 29/518* (2013.01); *H10B 41/10* (2023.02); *H10B 41/41* (2023.02); *H10B 43/35* (2023.02); *H10B 43/40* (2023.02); *H10B 43/50* (2023.02)

(56) References Cited

U.S. PATENT DOCUMENTS

| | | |
|---|---|---|
| 8,168,493 B2 | 5/2012 | Kim |
| 10,134,748 B2 | 11/2018 | Liu et al. |
| 2002/0006054 A1 | 1/2002 | Shukuri et al. |
| 2007/0087504 A1 | 4/2007 | Pham et al. |
| 2009/0072274 A1* | 3/2009 | Knoefler ........... H01L 27/11573 |
| | | 438/587 |
| 2015/0145022 A1 | 5/2015 | Chuang et al. |
| 2015/0187783 A1 | 7/2015 | Chuang et al. |
| 2016/0056250 A1 | 2/2016 | Chuang et al. |
| 2016/0190268 A1 | 6/2016 | Wu et al. |
| 2016/0307909 A1* | 10/2016 | Tseng ................... H01L 27/1157 |
| 2017/0110466 A1* | 4/2017 | Chuang ................. H10B 41/50 |
| 2017/0352675 A1 | 12/2017 | Mihara |
| 2018/0151579 A1* | 5/2018 | Liu .................... H01L 27/11534 |
| 2018/0211965 A1 | 7/2018 | Yoshida et al. |

OTHER PUBLICATIONS

Notice of Allowance dated Jun. 4, 2020 for U.S. Appl. No. 16/169,156.

* cited by examiner

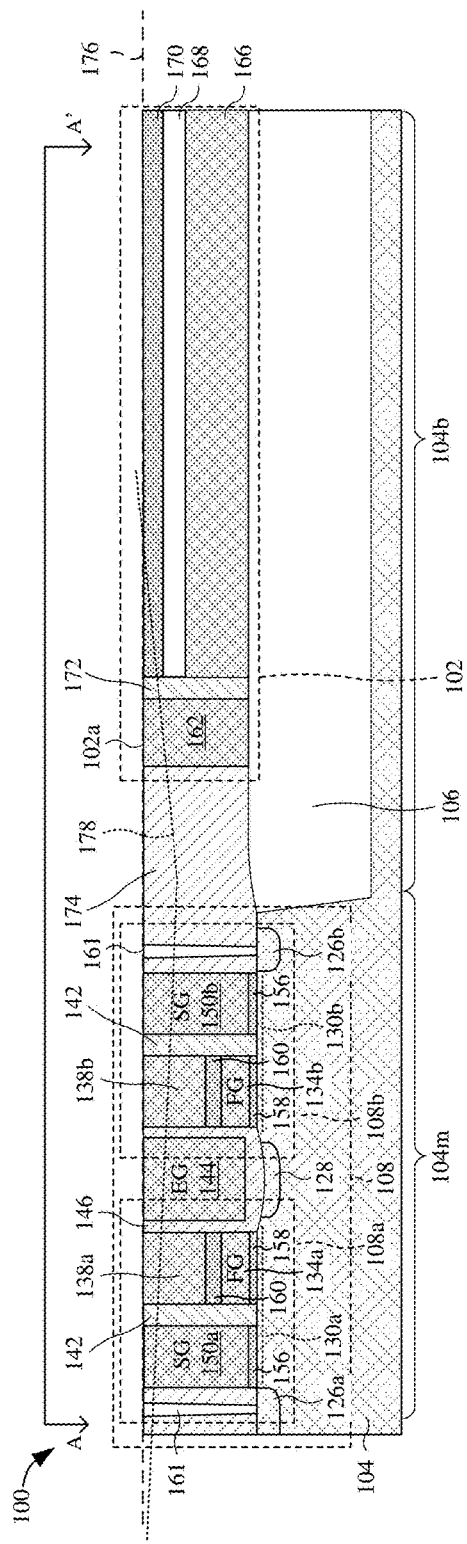
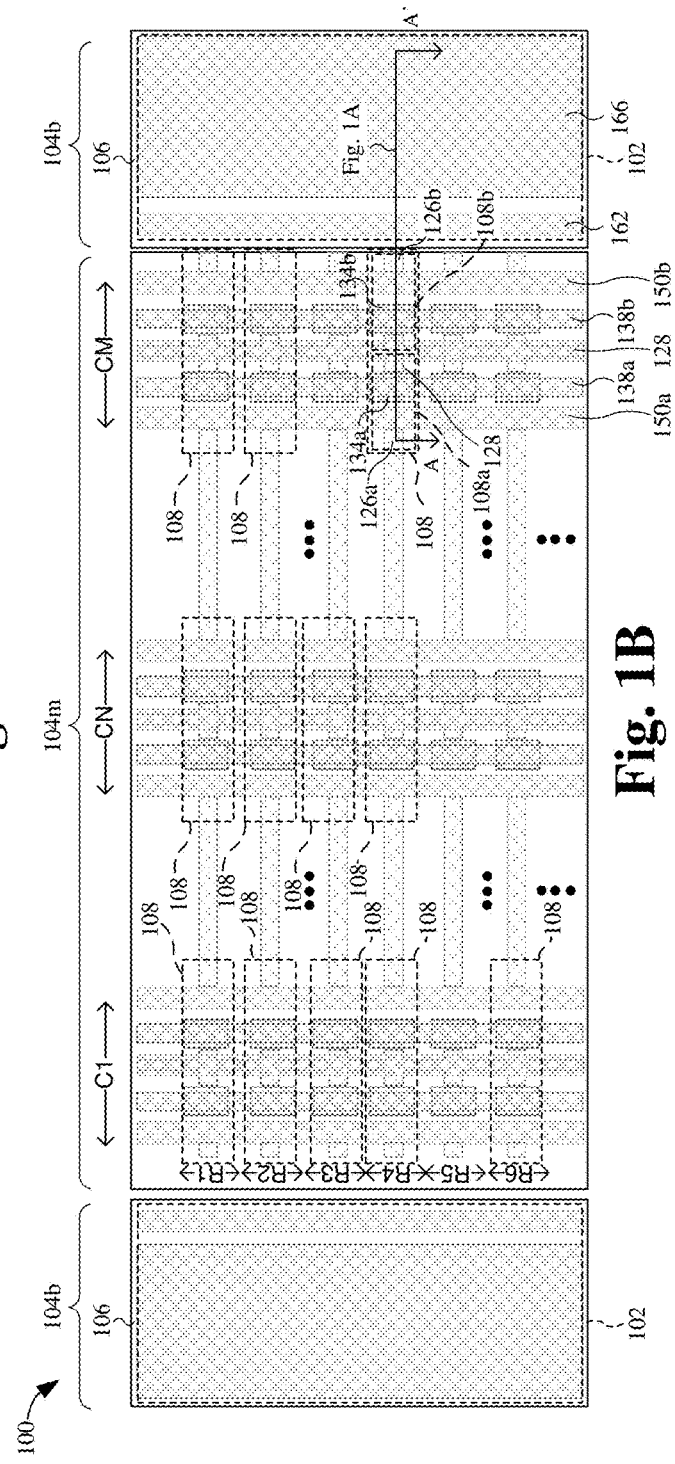
Fig. 1A
Fig. 1B

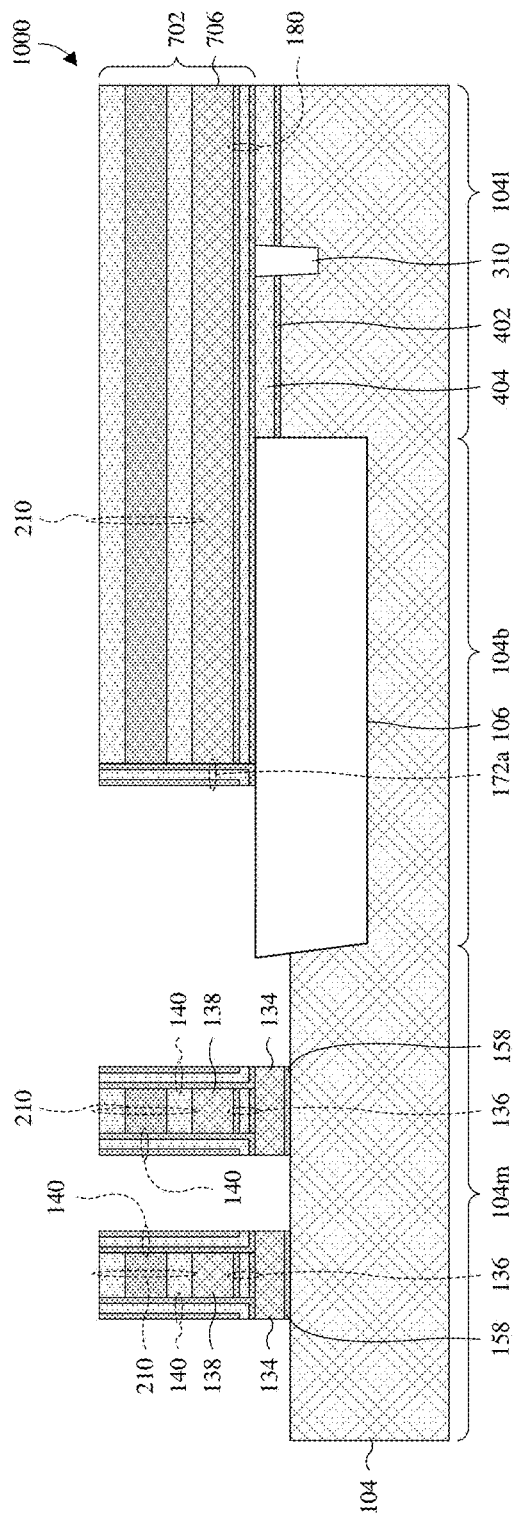
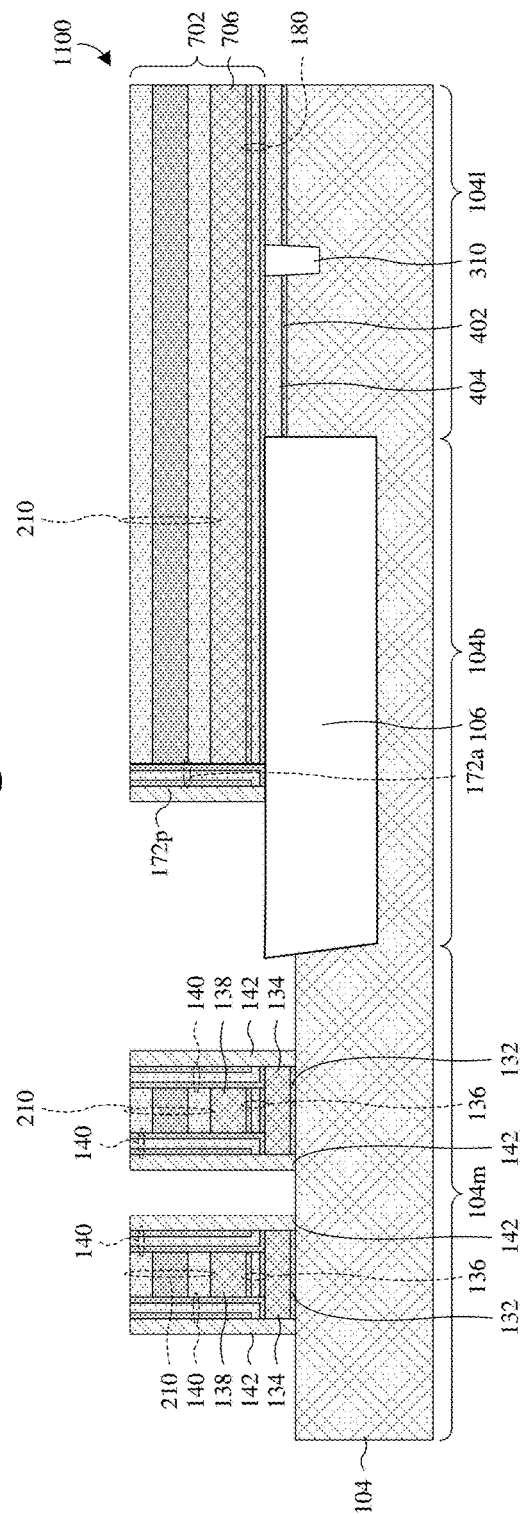
Fig. 10
Fig. 11

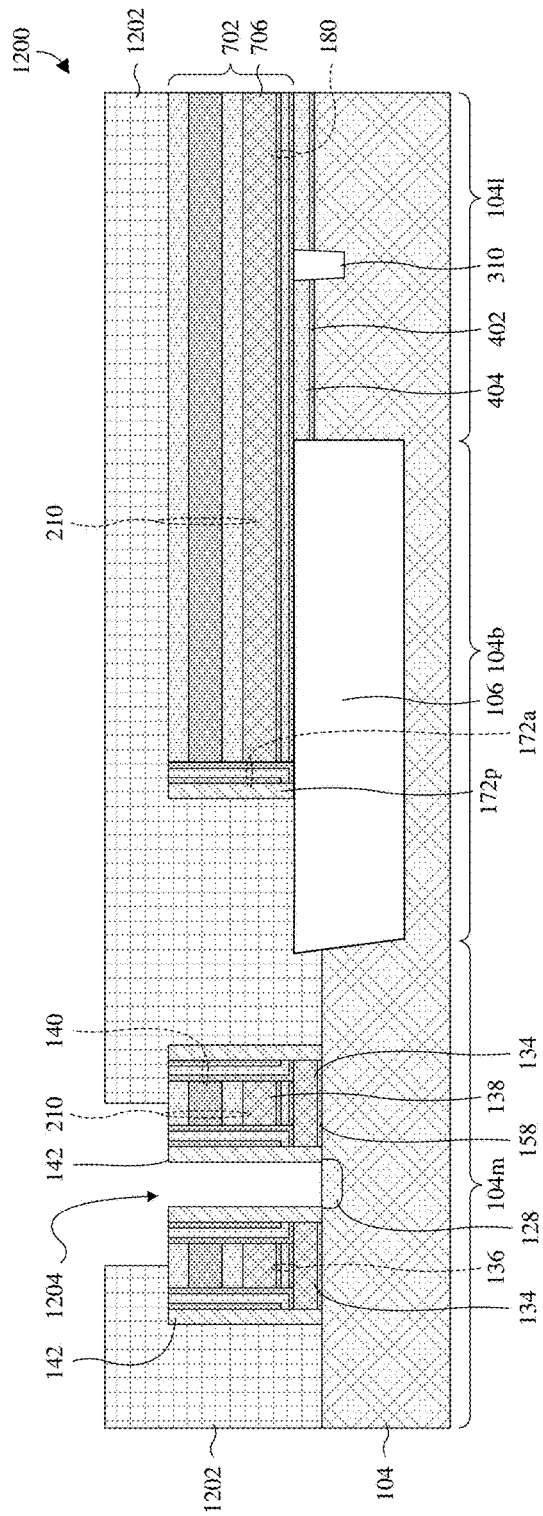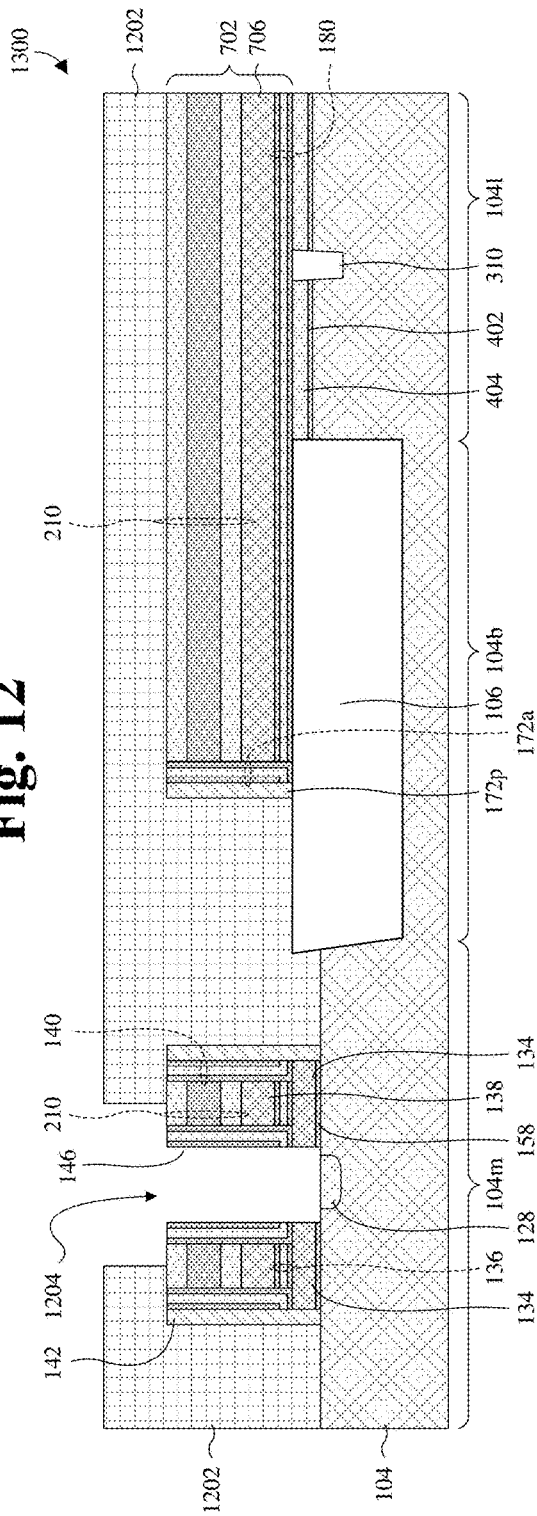
Fig. 12
Fig. 13

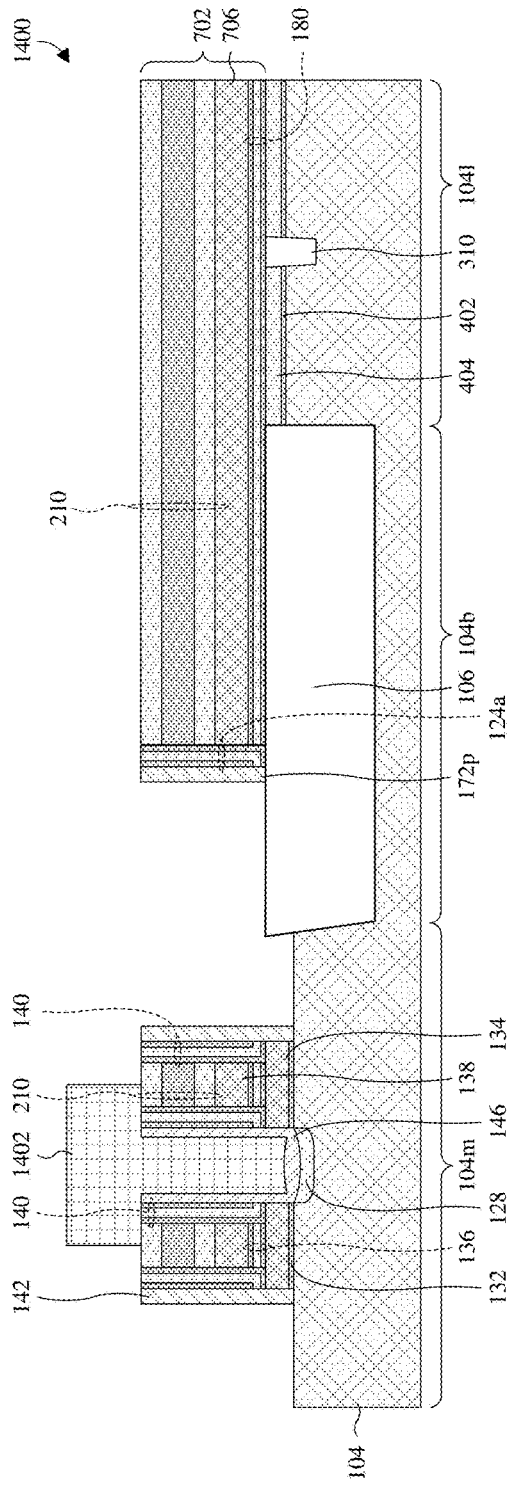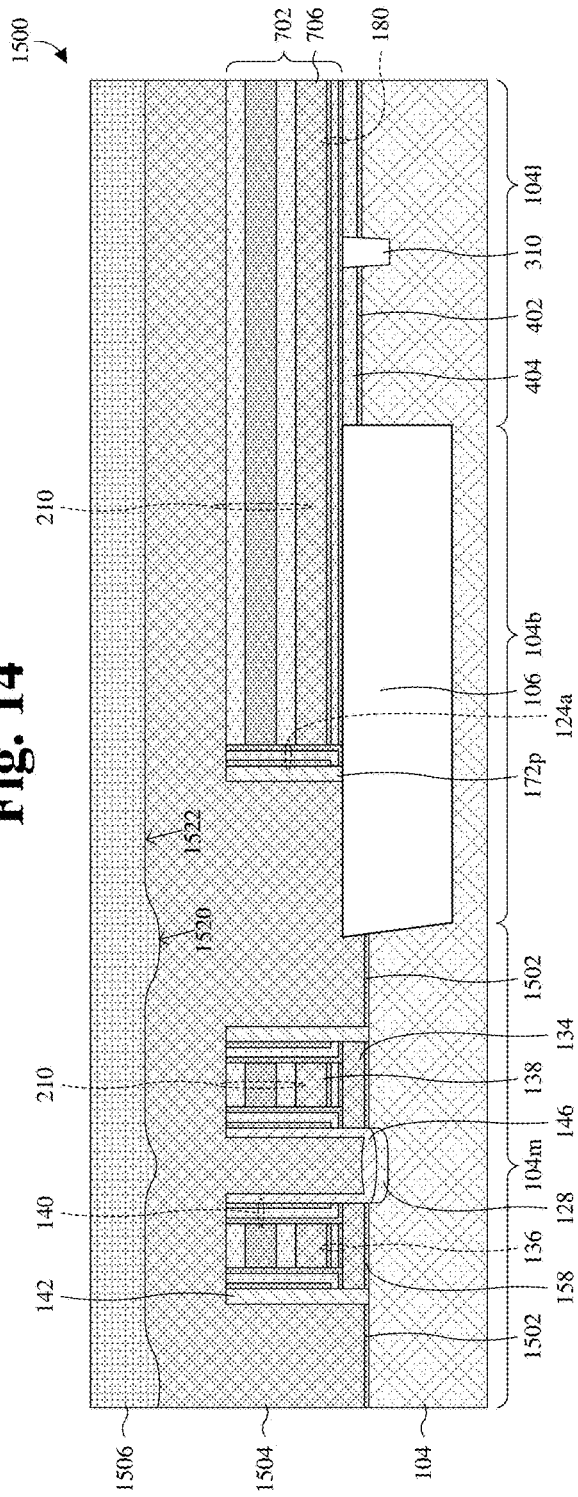
Fig. 14
Fig. 15

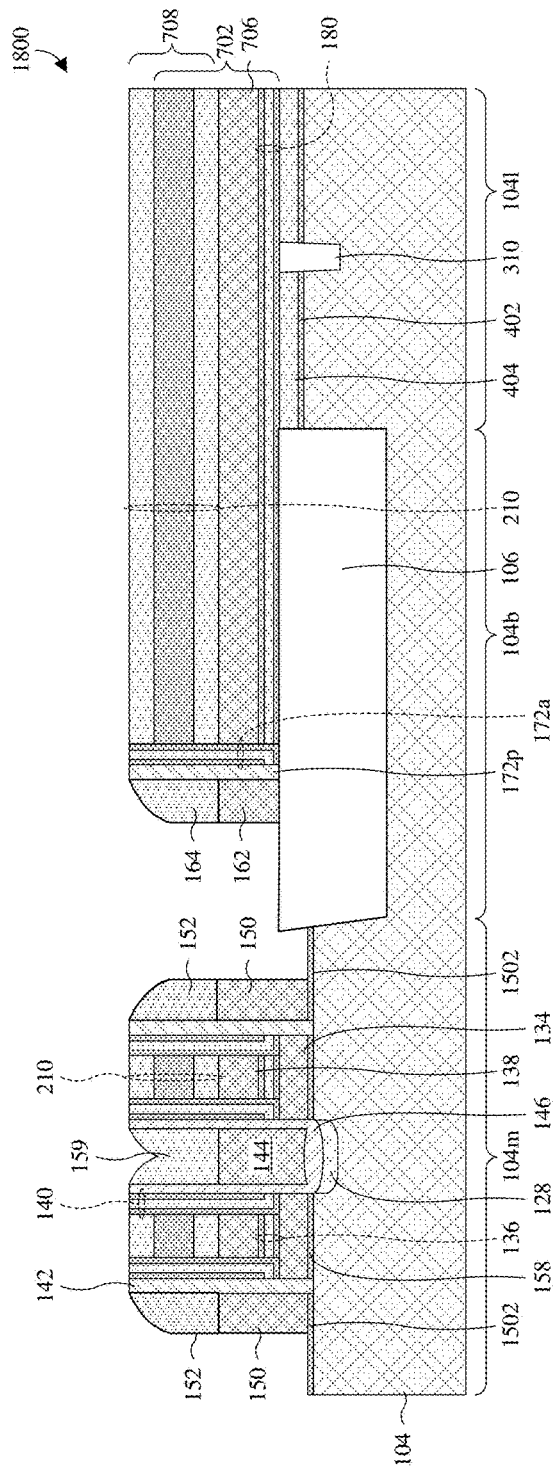
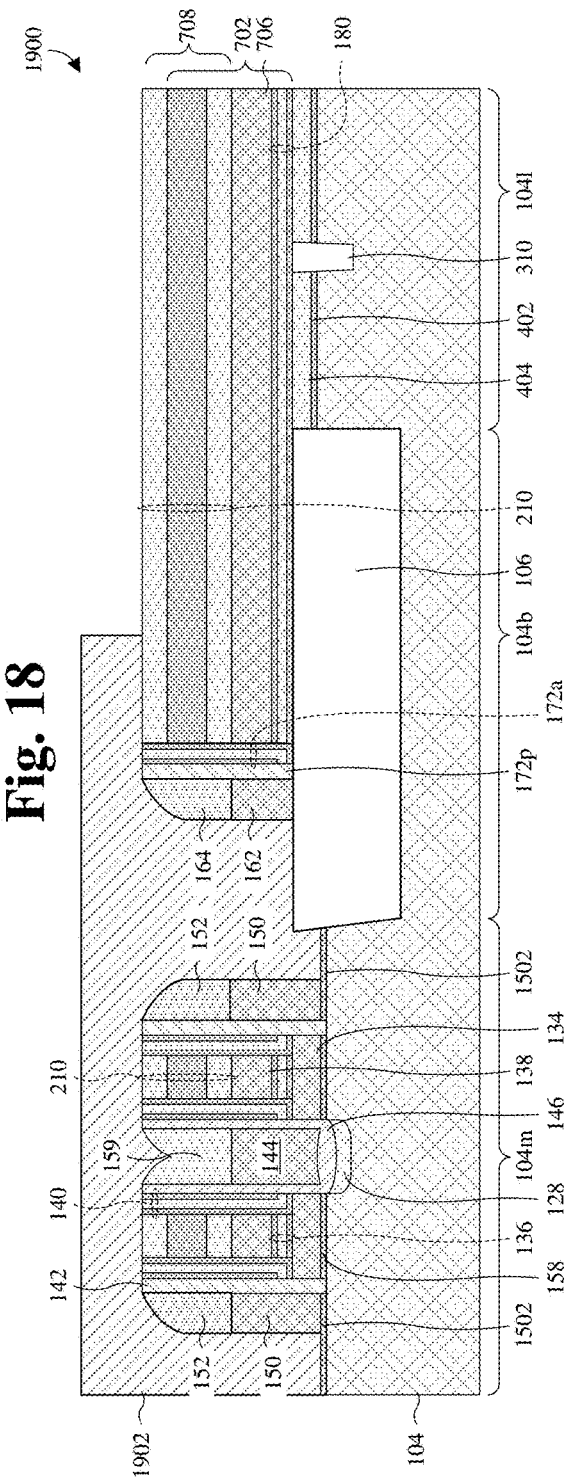
Fig. 18
Fig. 19

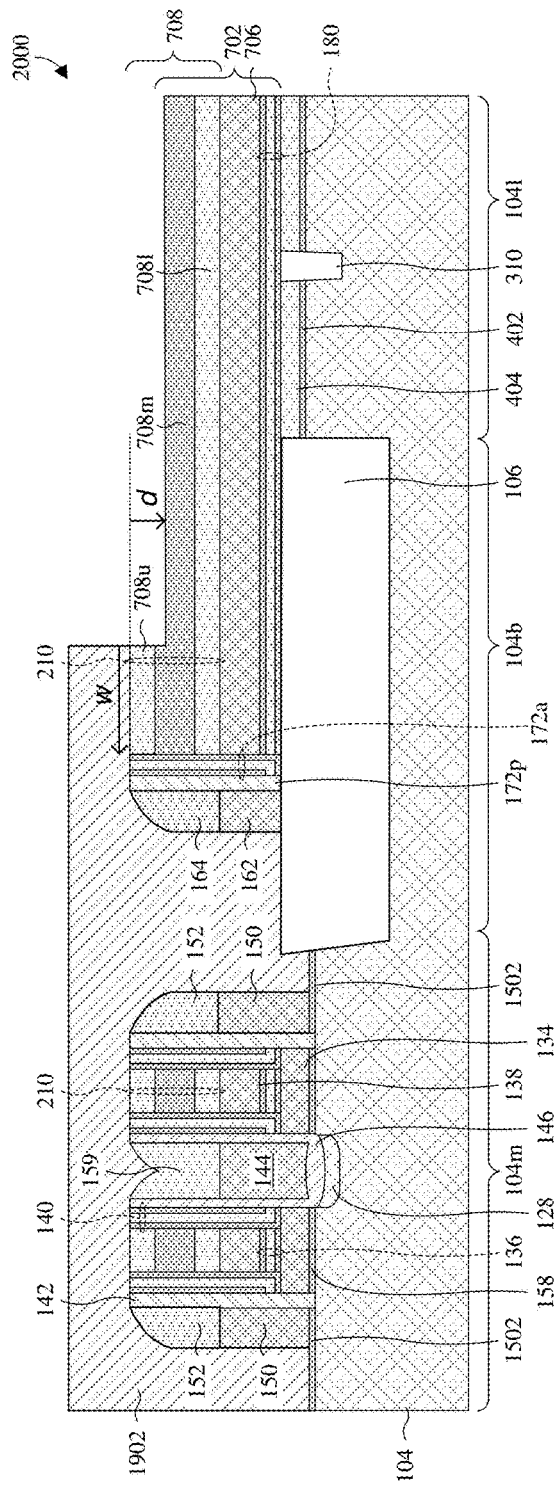
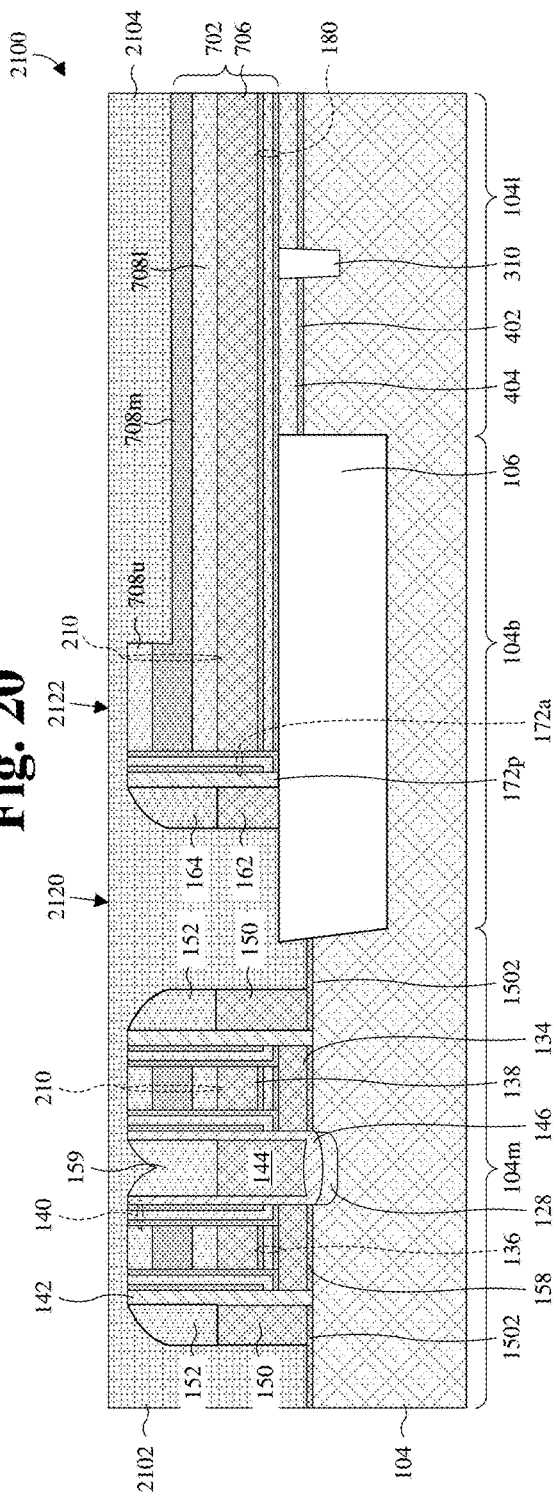
Fig. 20
Fig. 21

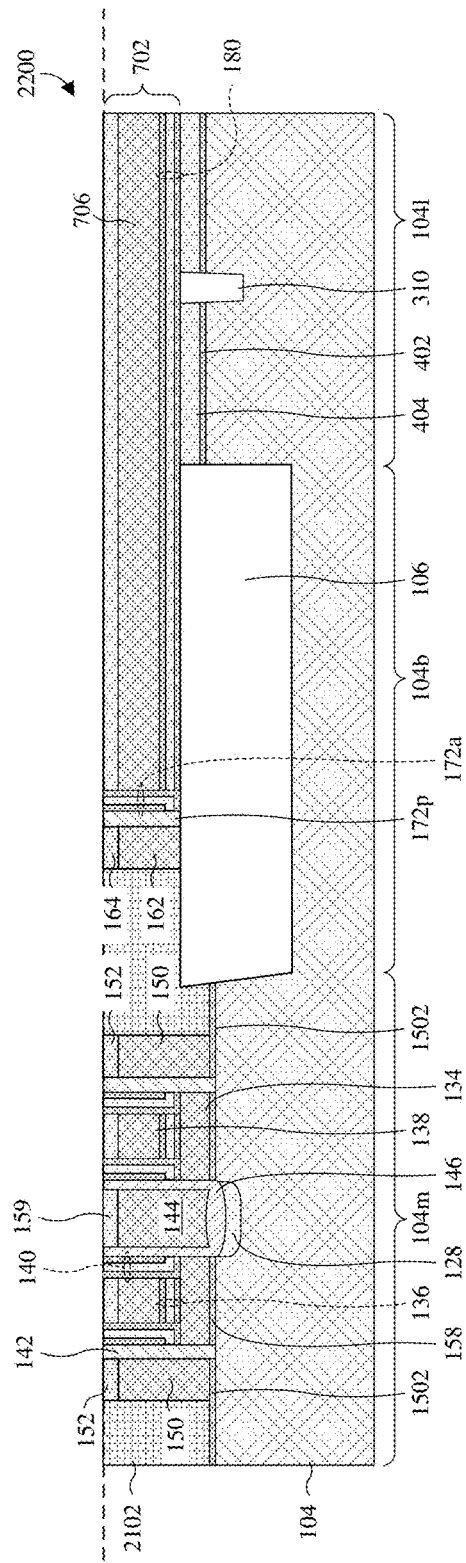
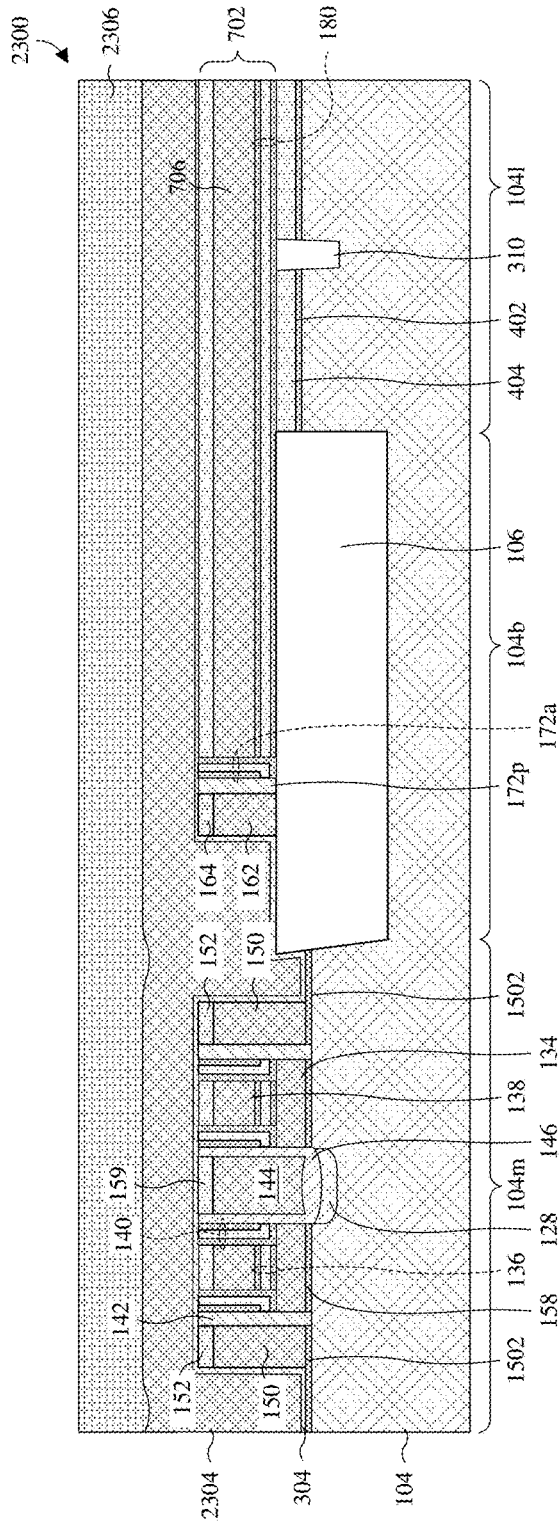
Fig. 22
Fig. 23

ANTI-DISHING STRUCTURE FOR EMBEDDED MEMORY

REFERENCE TO RELATED APPLICATIONS

This Application is a Divisional of U.S. application Ser. No. 16/169,156, filed on Oct. 24, 2018, which claims the benefit of U.S. Provisional Application No. 62/738,033, filed on Sep. 28, 2018. The contents of the above-referenced Patent applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology and high κ metal gate (HKMG) technology. Embedded memory technology is the integration of memory devices with logic devices on the same semiconductor chip, such that the memory devices support operation of the logic devices. High κ metal gate (HKMG) technology is the manufacture of semiconductor devices using metal gate electrodes and high-K gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of some embodiments of an integrated circuit (IC) comprising an embedded memory device with an anti-dishing structure.

FIG. 1B illustrates a partial top view of the IC of FIG. 1A.

FIGS. 4-39 illustrate a series of cross-sectional views of some embodiments of a method for forming an IC comprising an embedded memory boundary structure with a boundary sidewall spacer.

DETAILED DESCRIPTION

Figure 2A:
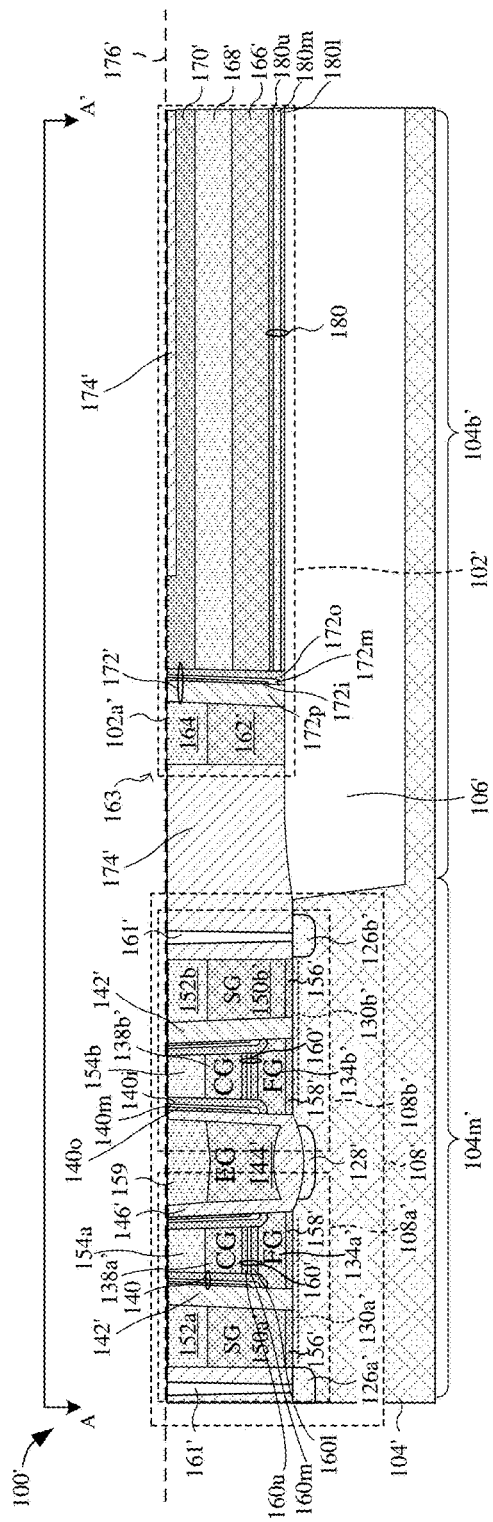
FIG. 2A illustrates a cross-sectional view of other embodiments of an integrated circuit (IC) comprising an embedded memory device with an anti-dishing structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

One type of embedded memory device is split gate flash memory. In such a memory device, an array of split gate flash memory cells are disposed in or over a semiconductor substrate. Peripheral circuitry, including logic devices such as address decoders and/or read write circuitry and/or microcontrollers, is arranged outside of the memory array and can control operation of the memory cells and/or perform other tasks. An isolation structure in the substrate separates the memory array from the peripheral circuitry.

Some aspects of the present disclosure lie in an appreciation that, in some cases, processing steps can cause gate electrodes or other structures nearest an outer edge of such a memory array to be shortened or "dished" compared to other features that are more centrally arranged in the array. For example, this "dishing" can arise when a boundary structure over the isolation region has an uppermost surface made of relatively "soft" dielectric (e.g., silicon dioxide), which causes CMP to erode the features of the flash memory cells on the outer edge of the array more quickly than features of the flash memory cells that are more centrally arranged within the array, thereby leading to memory cell features with slanted top surfaces near an outer edge of the array. This slanted top surface gives rise to several potential issues, and ultimately can lead to partial or complete failure of the memory device. For example, if an ion implantation is carried out after the CMP, the implanted ions could undesirably pass through the shortened gate electrodes and into the channel regions near the edge of the array, thereby adversely affecting the threshold voltage of the memory cells and potentially causing the memory cells to be corrupt/unusable. Alternatively, if the CMP causes "dishing" that is sufficient to undesirably expose upper surfaces of the gate electrodes, in some cases the gate electrodes may be undesirably silicided, and when a subsequent CMP is carried out, the subsequent CMP may remove this silicide and cause nickel contamination damaging various devices of the memory device.

In view of the foregoing, various embodiments of the present application are directed towards methods and devices that include an array of split gate flash memory cells, peripheral circuitry, and an isolation structure separating the array from the peripheral circuitry. To mitigate "dishing", these techniques make use of a dummy hardmask and/or dummy select gate electrode structure disposed on the isolation structure. This structure provides additional structural rigidity so that when an etch is performed during fabrication, the upper surfaces of the split gate flash memory cells (including select gate, erase gate, control gate, and/or hard masks over those gates) are planarized so their final heights are the same heights as an upper surface of the anti-dishing structure. In this way, the dummy hardmask and/or dummy select gate electrode structure limits "dishing" and retains planarized and/or equal height top surfaces for these structures, thereby reducing undesirable threshold voltage variations and/or limiting nickel contamination concerns.

FIG. 1A illustrates a cross-sectional view of some embodiments of an integrated circuit 100 that includes an anti-dishing structure 102, and FIG. 1B shows a top view of the integrated circuit 100 with a cross-sectional line A-A' corresponding to FIG. 1A's cross-sectional view. The integrated circuit 100 is disposed on a semiconductor substrate 104, which includes a memory region 104m and a boundary region 104b. An isolation structure 106, which comprises dielectric material, resides in the boundary region 104b and laterally surrounds the memory region 104m.

Referring briefly to FIG. 1B, the integrated circuit 100 includes an array of memory cells disposed in or on the memory region 104m. In the illustrated example, the array of memory cells includes a number of split gate flash memory cell pairs 108 that are arranged in 6 rows (R1-R6) and M columns (C1-CM), although in general, the array can include any number of columns and any number of rows. Within the memory array in the memory region 104m, a pair of split gate flash memory cells 108 resides at the intersection of each row and column. For purposes of readability, not all memory cells are labeled. Column 1 and column M are the outermost columns and are nearest to the boundary region 104b, while column CN is a column in a central region of the memory array. Thus, the cells in rows C1-CM are nearest the outer edge of the array (which may be referred to as "edge cells" in some contexts), and in some approaches may be more susceptible to dishing than cells in the central region of the array (which may be referred to as "central cells" in some contexts).

FIG. 1A's cross-section shows an example pair of split gate flash memory cells 108 located at the intersection of Column M and Row 4. The pair of split gate memory cells 108 includes a first memory cell 108a and a second memory cell 108b. First and second individual source/drain regions 126a, 126b (corresponding to the first and second memory cells 108a, 108b, respectively) are disposed in the semiconductor substrate 104, and a common source/drain region 128 (shared between the first and second memory cells) is disposed in the semiconductor substrate 104 and laterally spaced between the first and second individual source/drain regions 126a, 126b. The first individual source/drain region 126a is separated from the common source/drain region 128 by a first channel region 130a, and the common source/drain region 128 is separated from the second individual source/drain region 126b by a second channel region 130b. An erase gate (EG) electrode 144 is disposed over the common source/drain region 128, and is separated from the common source/drain region 128 by erase gate dielectric 146. First and second floating gate (FG) electrodes 134a, 134b are respectively over the first and second channel regions 130a, 130b. First and second control gate (CG) electrodes 138a, 138b respectively overlie the first and second floating gate electrodes 134a, 134b. First and second select gate (SG) electrodes 150a, 150b, respectively, overlie the first and second channel regions 130a, 130b respectively, and are laterally spaced from the erase gate 144 by the first and second floating gate electrodes 134a, 134b, respectively.

A select gate dielectric 156 separates the select gate electrodes 150a, 150b from the substrate 104, and a floating gate dielectric 158 separates the floating gate electrodes 134a, 134b from the substrate 104. A control gate dielectric 160 separates the floating gate electrodes 134a, 134b from the control gate electrodes 138a, 138b, respectively. In some embodiments, at least two of the select gate dielectric 156, floating gate dielectric 158, and/or control gate dielectric 160 can have the same composition and the same thickness as one another, but in other embodiments, each of select gate dielectric 156, floating gate dielectric 158, and control gate dielectric 160 can have a different composition and/or a different thickness than the others. Sidewall spacers 142 made of a dielectric material laterally separate the select gate electrodes 150a, 150b, from the floating gate electrodes 134a, 134b and control gate electrodes 138a, 138b.

The anti-dishing structure 102 is disposed on the isolation structure 106, and has an upper surface 102a that is co-planar with an upper surface of at least one of the control gates 138a, 138b; select gates 150a, 150b; and/or erase gate 144. In some cases, the anti-dishing structure 102 includes a dummy select gate structure 162 over the isolation structure 106. The anti-dishing structure 102 can also include a dummy control gate structure 166, hardmask layer 168 (e.g., hardmask layer 168 can comprise SiN) over the dummy control gate structure 166, and a dielectric layer 170 (e.g., $SiO_2$ layer which is different from 168) over the nitride layer 168. A dummy sidewall spacer 172 separates the dummy select gate structure 162 from the dummy control gate structure 166. An interlayer dielectric layer (ILD) 174 laterally separates the dummy select gate structure 162 from the select gate structure 150b. The ILD layer 174 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9, 3, 2, or 1. Further yet, in some embodiments, contact vias 161 extend through the ILD layer 174 to the source/drain regions 126a, 126b. The contact vias 161 are conductive and may be or otherwise comprise, for example, tungsten, aluminum copper, copper, aluminum, some other suitable metal(s), or some other suitable conductive material(s).

The dummy select gate structure 162 emulates the structural rigidity of the memory cell 108, such planarity and/or levelness is improved in that variations in height are limited/reduced between central cells and edge cells of the memory array compared to other approaches. Thus, when the device is manufactured, the dummy select gate electrode 162 provides sufficient structural integrity to limit erosion of the outer edges of the memory cell 108. For example, FIG. 1A illustrates that an upper surface 102a of the anti-dishing structure 102 is level with or co-planar with upper surfaces of each of the control gates 138a, 138b; select gates 150a, 150b; and erase gate 144 (see plane 176). In contrast, if the dummy select gate electrode 162 were not present, the top surfaces of the memory cell may exhibit different heights, resulting in a slanted top surface (see line 178) and/or height variations in select gate electrodes 150a, 150b over the memory device. Thus, the dummy select gate electrode 162 limits the formation of such a slanted top surface 178 and retains uniform heights for control gates 138a, 138b; select gates 150a, 150b; and/or erase gate 144. These uniform heights can help limit undesirable threshold voltage variations and/or help limit nickel contamination concerns.

With reference to FIG. 2A, a cross-sectional view of some other embodiments of an IC 100' that includes an anti-dishing structure 102' is provided. FIG. 2A has several structures that are analogous to those of FIG. 1A, and these features have been labeled with a tick mark on the corresponding reference numeral. For example, whereas FIG. 1A includes select gates 150a, 150b and control gates 138a, 138b with vertical sidewalls; FIG. 2A includes select gates 150a', 150b' and control gates 138a', and 138b' with angled (e.g., non-vertical) sidewalls. In addition, select gate hardmasks 152a, 152b are disposed over the select gate electrodes 150a, 150b, respectively; control gate hardmasks 154a, 154b are disposed over the control gates 138a', 138b', respectively; and an erase gate hardmask 159 is disposed over the erase gate 144'. Applicant notes that the select gate hardmasks 152a, 152b; control gate hardmasks 154a, 154b; and/or erase gate hardmask 159 are optional in that, in some instances, one or more of these hardmasks may be removed during the manufacturing process, and thus may be omitted from the final structure in some cases such as previously illustrated in FIG. 1A. In some embodiments, the hardmasks 152a, 152b, 154a, 154b and 159 have more uniform heights/thicknesses than previously achievable, due to the presence of the dummy select gate electrode 162' and/or dummy hard mask 164 structure. For example, in some cases without the dummy select gate electrode 162' and/or dummy hard mask 164 structure in place, a difference in height between a hardmask 152b for an edge cell of the memory array and a hardmask 152a for a central cell of the memory array was approximately 140 angstroms. However, in some embodiments of the present disclosure, this difference in height between a hardmask 152b for an edge cell of the memory array and a hardmask 152b for a central cell of the memory array is reduced to approximately 40 angstroms or less, for example approximately 36 angstroms in some cases.

The analogous structures in FIG. 2A may correspond in some regards to those same structures of FIG. 1A, but may have different structural details, as described further below.

A boundary region 104b' of the semiconductor substrate 104' laterally surrounds a memory region 104m' of the semiconductor substrate 104'. The semiconductor substrate 104' may be or otherwise comprise, for example, a bulk silicon substrate, a group III-V substrate, a silicon-on-insulator (SOI) substrate, or some other suitable semiconductor substrate(s).

A boundary isolation structure 106' comprises dielectric material and extends into the boundary region 104b' to laterally surround the memory region 104m'. The boundary isolation structure 106' may be or otherwise comprise, for example, a shallow trench isolation (STI) structure, a deep trench isolation (DTI) structure, some other suitable trench isolation structure(s), or some other suitable isolation structure(s).

Anti-dishing structure 102' is disposed on the boundary isolation structure 106'. The anti-dishing structure 102' includes a dummy select gate structure 163, a dummy control gate structure 166', a hardmask layer 168', a dielectric layer 170', and a boundary sidewall spacer 172'. An ILD 174' may also be present. The dummy control gate structure 166', which has an inner sidewall facing the memory region 104m', is disposed over the isolation structure 106', and in some cases is separated from the isolation structure 106' by a charge trapping dielectric structure 180. The boundary sidewall spacer 172', which also has an inner sidewall facing the memory region 104m', is disposed along the inner sidewall of the dummy control gate structure 166' and on the isolation structure 106'. The dummy select gate structure 163 is disposed along the inner sidewall of the boundary sidewall spacer 172' and on the isolation structure 106'. The dummy select gate structure 163 comprises a dummy select gate electrode 162' made of conductive material and disposed on the isolation structure 106'; and a dummy hardmask 164 disposed over the dummy select gate electrode 162' such that the upper surface of the dummy hardmask 164 is co-planar with an upper surface of the select gate hardmask 152b. Thus, the upper surface of the select gate hardmask 152b is disposed at the same height as the upper surface of the dummy hardmask 164, as measured perpendicularly from an upper surface of the substrate 104'. The dummy select gate electrode 162' may be or otherwise comprise, for example, doped polysilicon, metal, some other suitable conductive material(s), or any combination of the foregoing. The dummy hardmask 164 may be or otherwise comprise, for example, silicon oxide, silicon nitride, silicon oxynitride, some other suitable dielectric(s), or combinations thereof.

In some embodiments, the boundary sidewall spacer 172' directly contacts the inner sidewall of the dummy control gate structure 166', and/or extends continuously along the dummy control gate structure 166' from a bottommost edge of the dummy control gate structure 166' to a topmost edge of the dielectric layer 170'. The boundary sidewall spacer 172' may be or otherwise comprise, for example, silicon oxide, silicon nitride, silicon oxynitride, some other suitable dielectric(s), polysilicon, aluminum copper, tantalum, some other suitable metal(s) or metal alloy(s), tantalum nitride, titanium nitride, some other suitable metal nitride(s), or some other suitable material(s). Further, in some embodiments, the boundary sidewall spacer 172' can comprise an oxide-nitride-oxide structure, with an outer oxide layer 172o, middle-nitride layer 172m, and inner oxide layer 172i. A primary boundary sidewall spacer 172p, which can be made of an oxide (e.g., $SiO_2$) or a nitride (e.g., $Si_3N_4$) or combinations thereof, can separate the oxide-nitride-oxide structure from the dummy select gate electrode 162' and dummy hard mask 164. In other embodiments, the boundary sidewall spacer 172' may be homogeneous (e.g., a single body of material rather than the illustrated disparate portions).

The dummy control gate electrode 166' may be or otherwise comprise, for example, doped polysilicon, metal, some other suitable conductive material(s), or any combination of the foregoing. The dummy control gate dielectric layer 180 may be or otherwise comprise, for example, silicon oxide, silicon nitride, silicon oxynitride, some other suitable dielectric(s), or any combination of the foregoing. In some embodiments, the dummy control gate dielectric layer 180 comprises a lower oxide layer 180l, middle nitride layer 180m, and upper oxide layer 180u, thereby establishing an oxide-nitride-oxide (ONO) film.

The pair of split gate flash memory cells 108' includes a first memory cell 108a' and a second memory cell 108b'. A pair of floating gate dielectric layers 158', a pair of floating gate electrodes 134a', 134b', a pair of control gate dielectric layers 160', and a pair of control gate electrodes 138a', 138b' are stacked on the selectively-conductive memory channels 130a', 130b'. The floating gate dielectric layers 158' respectively overlie the selectively-conductive memory channels and may be or otherwise comprise, for example, silicon oxide or some other suitable dielectric(s). The floating gate electrodes 134a', 134b' respectively overlie the floating gate dielectric layers 158', the control gate dielectric layers 160' respectively overlie the floating gate electrodes 134a', 134b', and the control gate electrodes 138a', 138b' respectively overlie the control gate dielectric layers 160'. The control gate electrodes 138a', 138b' and floating gate electrodes 134a', 134b' may be or otherwise comprise, for example, doped polysilicon, metal, or some other suitable conductive material(s). The control gate dielectric layers 160' may be or otherwise comprise, for example, silicon nitride, silicon oxide, some other suitable dielectric(s), or any combination of the foregoing. In some embodiments, the control gate dielectric layers 160' each comprise ONO films, such that the control gate dielectric layers 160' each comprise a lower oxide layer 160l, an upper oxide layer 160u overlying the lower oxide layer 160l, and a middle nitride layer 160m sandwiched between the lower an upper oxide layers 160l, 160u. For ease of illustration, only one of the lower oxide layers 160l is labeled 160l, only one of the upper oxide layers 160u is labeled 160u, and only one of middle nitride layers 160m is labeled 160m.

A pair of control gate spacers 140 overlies each of the floating gate electrodes 134a', 134b' and line opposite sidewalls of the control gate electrodes 138a', 138b'. Because of space constraints on the page, only one control gate spacer 140 has been labeled. Floating gate spacers 142' respectively overlie the selectively-conductive memory channels, and each is laterally spaced from the common memory source/drain region 128' by a respective one of the floating gate electrodes 134'. Further, the floating gate spacers 142' each line a sidewall of the respective one of the floating gate electrodes 134'. The control gate spacers 140 and the floating gate spacers 142' may be or otherwise comprise, for example, silicon nitride, silicon oxide, some other suitable dielectric(s), or any combination of the foregoing. In some embodiments, the control gate spacers 140 are each ONO films. Thus, the control gate spacers 140 can comprise an oxide-nitride-oxide structure, with an outer oxide layer 140o, middle-nitride layer 140m, and inner oxide layer 140i. In other embodiments, the control gate spacers 140 may be homogeneous (e.g., a single body of material rather than the illustrated disparate portions). Further, the control gate spacers 140 may have lower most extents that extend below an uppermost surface of the floating gate electrodes 134a', 134b'. Moreover, the control gate spacers 140 may be conformal with regards to sidewalls of the floating gate electrodes 134a', 134b' and control gate electrodes 138a', 138b', and may have rounded corners in the upper portion of the floating gate electrodes 134a', 134b'. In some cases, the sidewalls of the spacers 140, 142' may be angled at an angle that is non-perpendicular relative to an upper surface of the substrate 104'—for example, an acute angle measured from the sidewall of the spacer 142', though the floating gates, and to the upper surface of the substrate 104' may range between 65° and 89° in some embodiments.

A pair of select gate dielectric layers 156' and a pair of select gate electrodes 150a', 150b' are stacked on the selectively-conductive memory channels 130a', 130b'. The select gate dielectric layers 156' respectively overlie the selectively-conductive memory channels 130, each laterally spaced from the common memory source/drain region 128' by a respective one of the floating gate electrodes 134a', 134b'. The select gate dielectric layers 156' may be or otherwise comprise, for example, silicon oxide, silicon nitride, or some other suitable dielectric(s). The select gate electrodes 150a', 150b' respectively overlie the select gate dielectric layers 156' and respectively border the floating gate spacers 142'. The select gate electrodes 150' may be or otherwise comprise, for example, doped polysilicon, metal, or some other suitable conductive material(s).

An erase gate electrode 144' and an erase gate dielectric layer 146' overlie the common memory source/drain region 128', laterally between the floating gate electrodes 134a', 134b'. The erase gate electrode 144' overlies the erase gate dielectric layer 146' and, in some embodiments, has a top surface even with top surfaces respectively of the control gate electrodes 138a', 138b' and/or a top surface of the anti-dishing structure 102'. The erase gate dielectric layer 146' cups an underside of the erase gate electrode 144' to vertically space the erase gate electrode 144' from the common memory source/drain region 128', and to laterally space the erase gate electrode 144' from the floating gate electrodes 134' and the control gate spacers 140'. The erase gate electrode 144' may have a concave upper surface, and may be or otherwise comprise, for example, doped polysilicon, metal, or some other suitable conductive material(s). The erase gate dielectric layer 146' may be or otherwise comprise, for example, silicon oxide, silicon nitride, or some other suitable dielectric(s).

Figure 2B:
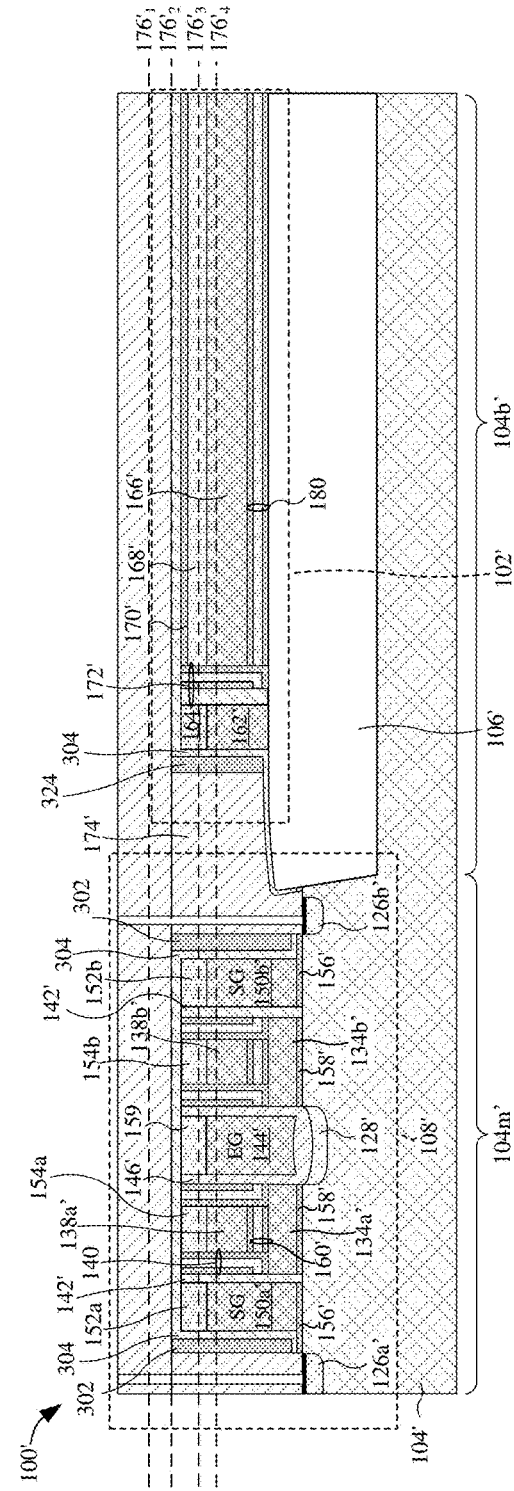
FIG. 2B illustrates a cross-sectional view of other embodiments of an integrated circuit (IC) comprising an embedded memory device with an anti-dishing structure.

With reference to FIG. 2B, a cross-sectional view of some other embodiments of an IC 100' that includes an anti-dishing structure 102' is provided. FIG. 2B has several structures that are analogous to those of FIGS. 1A-2A. However, for convenience, these features have been labeled with the same tick mark scheme as used in FIG. 2A, even though there may be structural differences between the corresponding reference numerals in FIG. 2A and FIG. 2B. For example, FIG. 1A includes select gates 150a, 150b and control gates 138a, 138b; while FIG. 2B includes select gates 150a', 150b' and control gates 138a', and 138b'.

FIG. 2B's split gate memory cell pair 108' has the same structural features as that of FIG. 2A, except that FIG. 2B shows the floating gate electrodes (134a', 134b'), control gate electrodes (138a', 138b'), and hard masks (154a', 154b') as having vertical sidewalls which are perpendicular to the upper surface of the substrate 104. In addition, FIG. 2B's split gate memory cell pair 108' also includes additional outermost sidewall spacers 302, which can be made of nitride, oxide, or combinations thereof. A liner layer 304, which can be made of nitride, oxide, or combinations thereof, separates the outermost sidewall spacers 302 from the select gate electrodes and select gate hardmasks 152. The liner layer 304 can have a different composition from the outermost sidewall spacer 302 in some embodiments. Depending on the manufacturing processed used to make the structure of FIG. 2B, the upper surface of the structure can be planarized to $176'_1$, $176'_2$, $176'_3$, or $176'_4$, with additional metal interconnect layers (not shown) being formed over the planarized upper surface $176'_1$, $176'_2$, $176'_3$, or $176'_4$. For example, if CMP stops on $176'_1$, portions of ILD 174 may correspond to the planarized upper surface of the anti-dishing structure; whereas if CMP stops on $176_2$, portions of liner layer 304 may correspond to the planarized upper surface of the anti-dishing structure; whereas if CMP stops on $176_3$, portions of hardmask layer 168' may correspond to the planarized upper surface of the anti-dishing structure; and whereas if CMP stops on $176_4$, portions of dummy control gate electrode 166' may correspond to the planarized upper surface of the anti-dishing structure.

Figure 3:
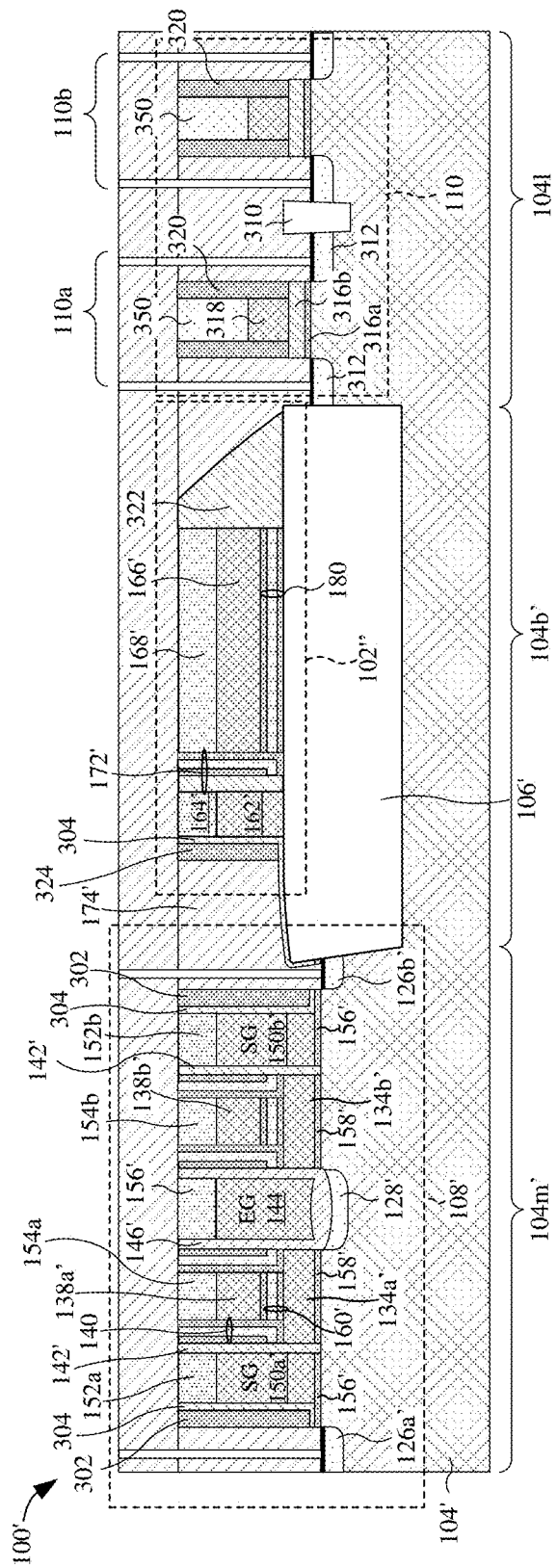
FIG. 3 illustrates a cross-sectional view of other embodiments of an integrated circuit (IC) comprising an embedded memory device with an anti-dishing structure.

FIG. 3 corresponds to FIG. 2B (e.g., planarized upper surface $176'_3$) but the view has been widened to illustrate logic circuitry 110 disposed on a logic region 1041 of the substrate 104'. The logic circuitry 110 includes a first logic device 110a and a second logic device 110b arranged on the logic region 1041 of the semiconductor substrate 104'. The first logic device 110a and a second logic device 110b are physically and electrically separated by a logic isolation structure 310 laterally between the first and second logic devices 110a, 110b. The logic isolation structure 310 extends into a top of the semiconductor substrate 104' and may be or otherwise comprise, for example, an STI structure, a DTI structure, or some other suitable isolation structure(s). The first and second logic devices 110a, 110b may each be, for example, an IGFET, a MOSFET, a DMOS device, some other suitable transistor device(s), or some other suitable semiconductor device(s).

The first and second logic devices 110a, 110b each comprise a pair of logic source/drain regions 312 and a selectively-conductive logic channel. The logic source/drain regions 312 of each pair are in a top of the semiconductor substrate 104' and are laterally spaced. Further, the logic source/drain regions 312 of each pair are doped semiconductor regions having a first doping type (e.g., p-type or n-type). The selectively-conductive logic channels are in the top of the semiconductor substrate 104, and each of the selectively-conductive logic channels is between and adjoins the logic source/drain regions 312 of a respective pair of logic source/drain regions 312. Further, each of the selectively-conductive logic channels is a doped semiconductor region having a second doping type (e.g., p-type or n-type) opposite the first doping type of the respective pair of logic source/drain regions 312.

A pair of first logic gate dielectric layers 316a, a pair of second logic gate dielectric layers 316b, and a pair of logic gate electrodes 318 are stacked on the selectively-conductive logic channels. The first logic gate dielectric layers 316a respectively overlie the selectively-conductive logic channels, the second logic gate dielectric layers 316b respectively overlie the first logic gate dielectric layers 316a, and the logic gate electrodes 318 respectively overlie the second logic gate dielectric layers 316b. The logic gate electrodes 318 may be or otherwise comprise, for example, doped polysilicon, metal, or some other suitable conductive material(s). The first and second logic gate dielectric layer 316a, 316b may be or otherwise comprise, for example, silicon nitride, silicon oxide, a high κ dielectric, some other suitable dielectric(s), or any combination of the foregoing. In some embodiments, the first logic gate dielectric layers 316a are silicon oxide, the second logic gate dielectric layers 316b are a high κ dielectric, and the logic gate electrodes 318 are metal. In some embodiments, the logic sidewall spacers 320 line sidewalls of the logic gate electrodes 318. A logic hardmask 350 may overlie the logic gate electrodes 318 in some embodiments.

Further, the anti-dishing structure of FIG. 3 includes a boundary sidewall spacer 322 facing the logic region 104l. In some embodiments, a width of the boundary sidewall spacer 322 increases continuously from top to bottom. The width may, for example, be between about 50-10,000 angstroms, between about 50-5,000 angstroms, or between about 5,000-10,000 angstroms. Further, in some embodiments, the height of the boundary sidewall spacer 322 decreases continuously along the width, from the midpoint to an opposite side of the boundary sidewall spacer 322 as an innermost sidewall spacer 324. The height may, for example, be between about 50-10,000 angstroms, between about 50-5,000 angstroms, or between about 5,000-10,000 angstroms.

The sidewall of the boundary sidewall spacer 322 is slanted downward and has a slant angle θ relative to a bottom surface of the boundary sidewall spacer 322. The slant angle θ may be or otherwise comprise, for example, less than about 50 degrees, about 60 degrees, about 75 degrees, or about 80 degrees, and/or may be or otherwise comprise, for example, between about 70-80 degrees, about 50-80 degrees, or about 60-70 degrees.

The innermost sidewall spacer 324, which can be made of oxide or nitride for example, faces the memory region 108', and liner layer 304 which can be made of oxide or nitride and have the same or different composition from the innermost sidewall spacer 324, separates the innermost sidewall spacer 324 from the isolation structure 106'.

Figure 4:
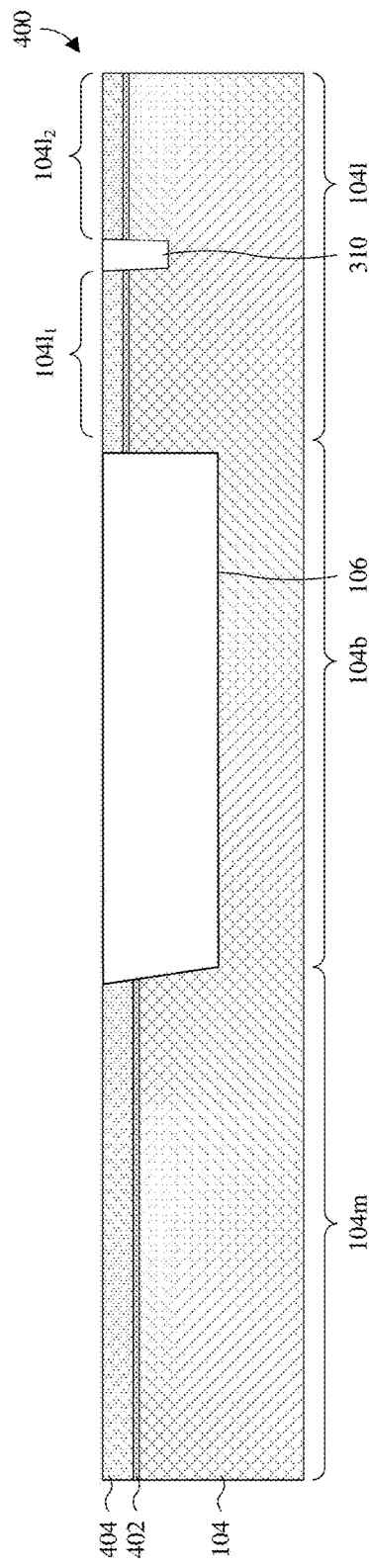

With reference to FIGS. 4-37, a series of cross-sectional views 400-3700 illustrate some embodiments of a method for forming an IC comprising an anti-dishing structure As illustrated by the cross-sectional view 400 of FIG. 4, a boundary isolation structure 106 is formed in a boundary region 104b of a semiconductor substrate 104. The boundary region 104b separates a memory region 104m of the semiconductor substrate 104 from a logic region 104l of the semiconductor substrate 104, and the boundary isolation structure 106 provides electrical separation between semiconductor devices formed hereafter on the memory region 104m and the logic region 104l. The boundary isolation structure 106 may, for example, have a stepped bottom surface stepping up from the memory region 104m to the logic region 104l, and/or may, for example, comprise a dielectric material. In some cases, the boundary isolation structure may have sidewalls that are angled differently from each other. This may arise due during formation of the boundary region when an etch is performed to form a trench in the semiconductor substrate 104 where boundary isolation structure is to be formed. When this etch is carried out, differences in dopant concentration on opposite sidewalls of the trench can cause one sidewall of the trench to be more vertical and the other sidewall of the trench to be more tapered. Then when dielectric material is formed to fill in the trench, for example though CVD, PVD, etc., the resultant boundary isolation structure has sidewalls with different angles. Further, the boundary isolation structure 106 may be or otherwise comprise, for example, a STI structure, a DTI structure, or some other suitable isolation region(s). The semiconductor substrate 104 may be or otherwise comprise, for example, a bulk silicon substrate, a SOI substrate, a group III-V substrate, or some other suitable semiconductor substrate(s).

Also illustrated by the cross-sectional view 400 of FIG. 4, a logic isolation structure 310 is formed in the logic region 104l to divide the logic region 104l into a first logic region 104l1 and a second logic region 104l2. The first logic region 104l1 is laterally between the boundary isolation structure 106 and the second logic region 104l2. The second logic region 104l2 may, for example, support core logic devices formed hereafter, whereas the first logic region 104l1 may, for example, support high voltage logic devices formed hereafter. The high voltage logic devices may, for example, be logic devices configured to operate at higher voltages (e.g., an order of magnitude higher) than the core logic devices. The logic isolation structure 310 may, for example, comprise a dielectric material, and/or may be or otherwise comprise, for example, a STI structure, a DTI structure, or some other suitable isolation region(s).

In some embodiments, a process for forming the boundary isolation structure 106 and the logic isolation structure 310 comprises forming a lower pad layer 402 covering the semiconductor substrate 104, and further forming an upper pad layer 404 covering the lower pad layer 402. The lower and upper pad layers 402, 404 are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The lower pad layer 402 may, for example, be formed of silicon oxide or some other suitable dielectric(s), and/or the upper pad layer 404 may, for example, be formed by silicon nitride or some other suitable dielectric(s). The lower and upper pad layers 402, 404 are patterned with layouts of the boundary and logic isolation structures 106, 310, and an etch is performed into the semiconductor substrate 104 with the lower and upper pad layers 402, 404 in place to form trenches with the layouts. A dielectric layer is formed covering the upper pad layer 404 and filling the trenches, and a planarization is performed to the upper pad layer 404 to form the boundary and logic isolation structures 106, 310 in the trenches. The dielectric layer may, for example, be formed of silicon oxide or some other suitable dielectric material(s), and/or may, for example, be performed by CVD, PVD, sputtering, or some other suitable deposition process(es). The planarization may, for example, be performed by a chemical mechanical polish (CMP) or some other suitable planarization process(es). The patterning may, for example, be performed using photolithography and an etching process.

Figure 5:
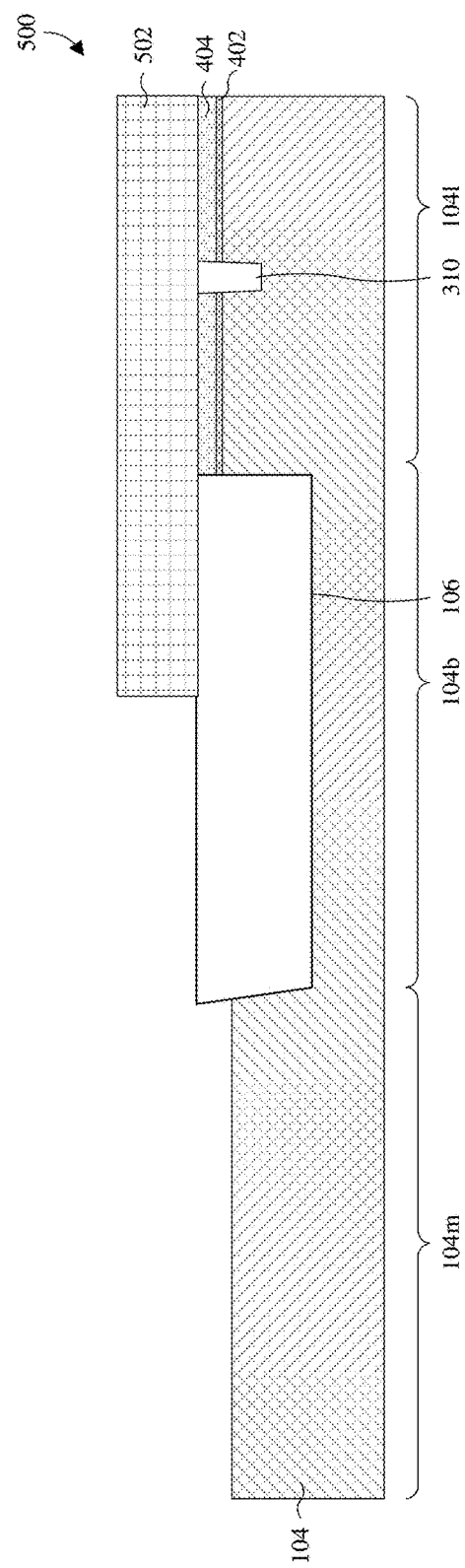

As illustrated by the cross-sectional view 500 of FIG. 5, an etch is performed into the upper pad layer 404 to remove the upper pad layer 404 from the memory region 104*m*, but not the logic region 104*l*. In some embodiments, a process for performing the etch comprises forming and patterning a photoresist layer 502 on the upper pad layer 404, such that the photoresist layer 502 covers the logic region 104*l*, but not the memory region 104*m*. An etchant is then applied to the upper pad layer 404 with the photoresist layer 502 in place until the upper pad layer 404 and lower pad layer 402 are removed from the memory region 104*m*, and the photoresist layer 502 is thereafter stripped.

Figure 6:
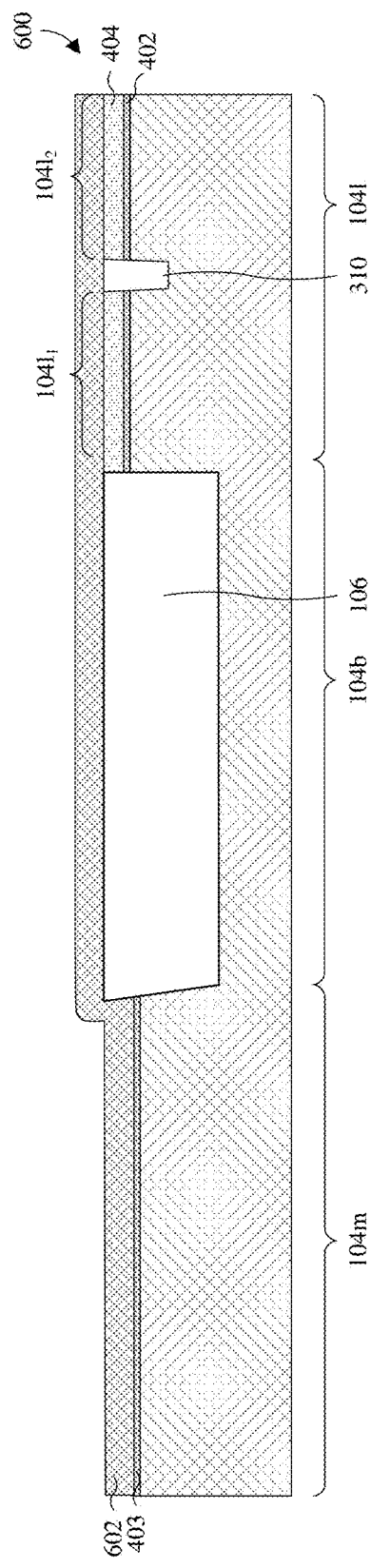

As illustrated by the cross-sectional view 600 of FIG. 6, a gate oxide 403 can then be grown. A floating gate layer 602 is then formed covering the memory region 104*m*, the boundary region 104*b*, and the logic region 104*l*. The floating gate layer 602 may, for example, be formed conformally, and/or may, for example, be formed of doped polysilicon, metal, or some other suitable conductive material(s). In some embodiments, the floating gate layer 602 is formed by CVD, PVD, sputtering, or some other suitable deposition process(es).

Figure 7:
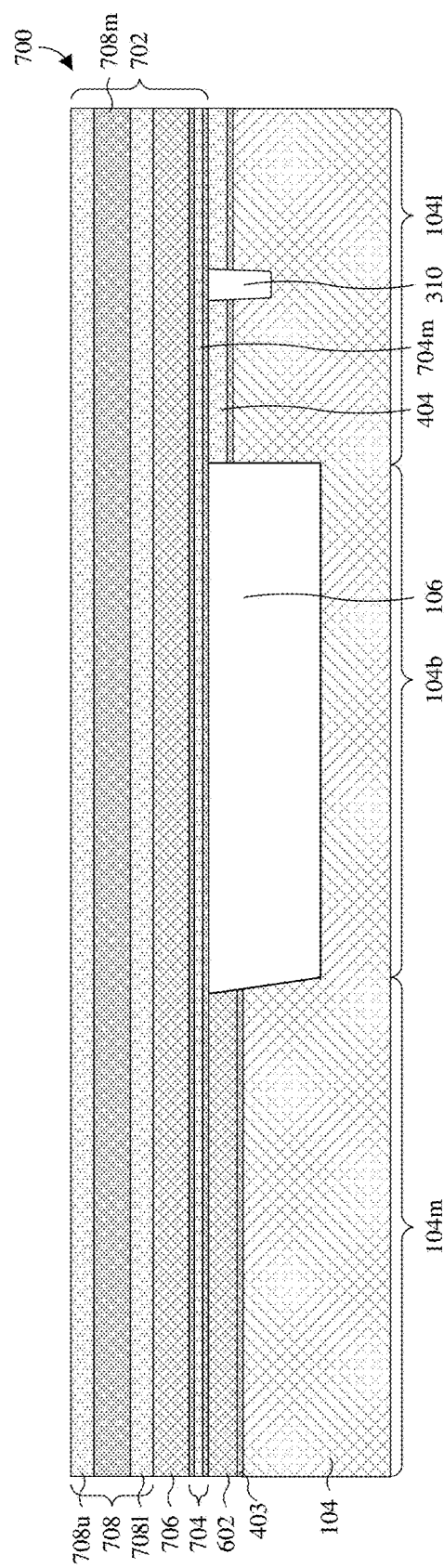

As illustrated by the cross-sectional view 700 of FIG. 7, a planarization is performed on the floating gate layer 602 until the boundary isolation structure 106 is reached, thereby removing the floating gate layer 602 from the boundary isolation structure 106 and the logic region 104*l*. In some embodiments, the planarization recesses a topmost surface of the floating gate layer 602 to about even with a topmost surface of the boundary isolation structure 106 and the upper pad layer 404. The planarization may, for example, be performed by a CMP or some other suitable planarization process(es).

Also illustrated by the cross-sectional view 700 of FIG. 7, a multilayer memory film 702 is formed covering the floating gate layer 602, the boundary and logic isolation structures 106, 310, and the upper pad layer 404. The multilayer memory film 702 comprises a control gate dielectric layer 704, a control gate layer 706, and a control gate hard mask layer 708.

The control gate dielectric layer 704 is formed covering the floating gate layer 602, the boundary and logic isolation structures 106, 310, and the upper pad layer 404. In some embodiments, the control gate dielectric layer 704 comprises silicon oxide, silicon nitride, some other suitable dielectric(s), or any combination of the foregoing. For example, the control gate dielectric layer 704 may be an ONO film, and/or may comprise a lower oxide layer 704*l*, a middle nitride layer 704*m* covering the lower oxide layer 704*l*, and an upper oxide layer 704*u* covering the middle nitride layer 704*m*. The control gate dielectric layer 704 may, for example, be formed by CVD, PVD, some other suitable deposition process(es), or any combination of the foregoing.

The control gate layer 706 is formed covering the control gate dielectric layer 704. The control gate layer 706 may, for example, be formed conformally, and/or may, for example, be formed of doped polysilicon, metal, or some other suitable conductive material(s). In some embodiments, a process for forming the control gate layer 706 comprises depositing the control gate layer 706, implanting dopants into the control gate layer 706, and annealing the control gate layer 706 to activate the dopants. Further, in some embodiments, the control gate layer 706 is formed by CVD, PVD, or some other suitable deposition process(es).

The control gate hard mask layer 708 is formed covering the control gate layer 706. In some embodiments, the control gate hard mask layer 708 comprises silicon oxide, silicon nitride, some other suitable dielectric(s), or any combination of the foregoing. For example, the control gate hard mask layer 708 may be a oxide-nitride-oxide (ONO) film, and/or may comprise a lower oxide layer 708*l*, a middle nitride layer 708*m* covering the lower oxide layer 708*l*, and an upper oxide layer 708*u* covering the middle nitride layer 708*m*. The control gate hard mask layer 708 may, for example, be formed by CVD, PVD, some other suitable deposition process(es), or any combination of the foregoing.

Figure 8:
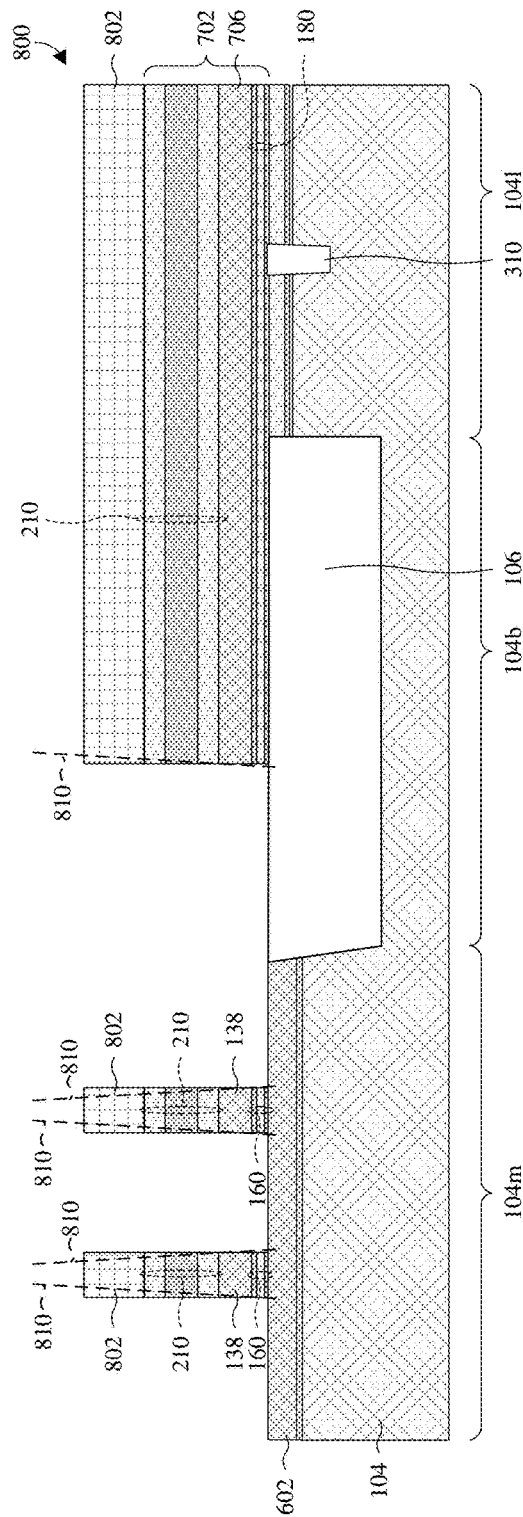

As illustrated by the cross-sectional view 800 of FIG. 8, an etch is performed into the multilayer memory film 702 to remove portions of the multilayer memory film 702 from the memory region 104*m*, thereby forming a pair of control gate electrodes 138 on the floating gate layer 602. Further, the etch forms a pair of control gate dielectric layers 160 and a pair of control gate hard masks 210. The control gate dielectric layers 160' respectively underlie the control gate electrodes 138, and the control gate hard masks 210 respectively overlie the control gate electrodes 138. In some embodiments, a process for performing the etch comprises forming and patterning a photoresist layer 802 on the multilayer memory film 702. The photoresist layer 802 is patterned so as to cover the boundary region 104*b* and the logic region 104*l*, and so as to partially cover the memory region 104*m* with a layout of the control gate electrodes 138. An etchant is then applied to the multilayer memory film 702 with the photoresist layer 802 in place until the etchant reaches the floating gate layer 602, and the photoresist layer 802 is thereafter stripped. In some embodiments, outer sidewalls of the control gate dielectric layers 160, CG electrodes 138, and control gate hardmasks 210 are perpendicular relative to an upper surface of the substrate 104. However, in some embodiments, outer sidewalls of the control gate dielectric layers 160, control gate electrodes 138, and/or control gate hard masks 210 may be angled (see angled lines 810) so as to be non-perpendicular relative to an upper surface of the substrate 104.

Figure 9:
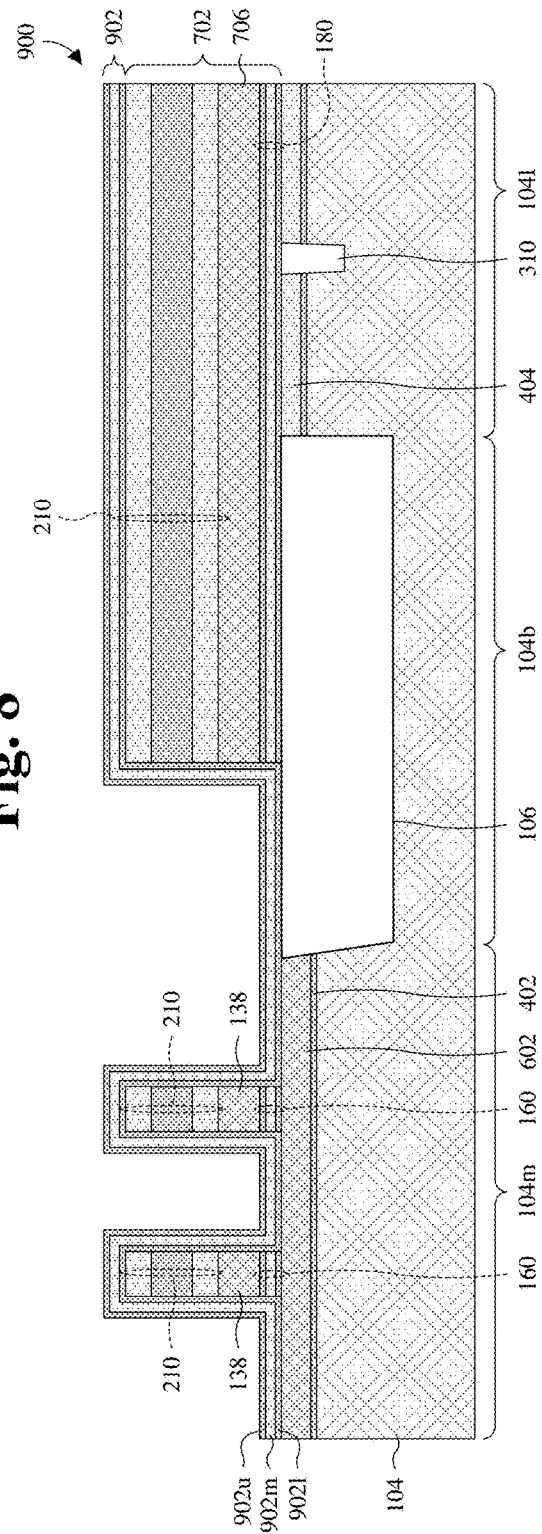

As illustrated by the cross-sectional view 900 of FIG. 9, a control gate spacer layer 902 is formed covering and lining the structure of FIG. 8. The control gate spacer layer 902 may, for example, be formed conformally, and/or may, for example, be formed of silicon oxide, silicon nitride, some other suitable dielectric(s), or any combination of the foregoing. In some embodiments, the control gate spacer layer 902 is or otherwise comprises an ONO film, and/or comprises a lower oxide layer 902l, a middle nitride layer 902m overlying the lower oxide layer 902l, and an upper oxide layer 902u overlying the middle nitride layer 902m. Further, the control gate spacer layer 902 may, for example, be formed by CVD, PVD, or some other suitable deposition process(es).

As illustrated by the cross-sectional view 1000 of FIG. 10, an etch is performed into the control gate spacer layer 902 (see FIG. 9) to form control gate spacers 140 along sidewalls of the control gate electrodes 138. Further, the etch forms a portion of a sidewall spacer 172a facing the memory region 104m, overlying the boundary isolation structure 106, and along a sidewall of the multilayer memory film 702. In some embodiments, a process for performing the etch comprises applying one or more etchants to the control gate spacer layer 902 until horizontal segments of the control gate spacer layer 902 are removed.

Also illustrated by the cross-sectional view 1000 of FIG. 10, an etch is performed into the floating gate layer 602 (see FIG. 9) and the gate oxide 403 to form a pair of floating gate electrodes 134 and a pair of floating gate dielectric layers 158. The floating gate electrodes 134 respectively underlie the control gate electrodes 138 and are formed from the floating gate layer 602. The floating gate dielectric layers 158 respectively underlie the floating gate electrodes 134 and are formed from the gate oxide 403. During the etch, the control gate spacers 140 and the control gate hard masks 210 serve as a mask.

As illustrated by the cross-sectional view 1100 of FIG. 11, floating gate spacers 142 are formed on sidewalls of the floating gate electrodes 134 and the control gate spacers 140. Further, a primary dummy gate spacer 172p is formed on a sidewall of the dummy gate spacer 172a. In some embodiments, the floating gate spacers 142 and the primary dummy gate spacer 172p comprise silicon oxide, some other suitable oxide(s), or some other suitable dielectric(s). Further, in some embodiments, a process for forming the floating gate spacers 142 and the primary dummy gate spacer 172p comprises depositing a floating gate spacer layer covering and lining the structure of FIG. 10. An etch is then performed into the floating gate spacer layer to remove horizontal segments of the floating gate spacer layer without removing vertical segments of the floating gate spacer layer. The floating gate spacer layer may, for example, be deposited conformally, and/or may, for example, be formed by CVD, PVD, or some other suitable deposition process(es).

As illustrated by the cross-sectional view 1200 of FIG. 12, a common memory source/drain region 128 is formed in the semiconductor substrate 104, laterally between the floating gate electrodes 134. In some embodiments, a process for forming the common memory source/drain region 128 comprises forming and patterning a photoresist layer 1202 covering the logic and boundary regions 104l, 104b, and further covering the memory region 104m outside a common source/drain gap 1204 laterally between the floating gate electrodes 134. Ion implantation or some other suitable doping process(es) is performed with the photoresist layer 1202 in place. The photoresist layer 1202 may, for example, be patterned using photolithography.

As illustrated by the cross-sectional view 1300 of FIG. 13, an etch is performed to remove floating gate spacers 142 within the common source/drain gap 1204. In some embodiments, a process for performing the etch comprises applying an etchant to the floating gate spacers 142 with the photoresist layer 1202 of FIG. 12 in place until exposed floating gate spacers are removed from the common source/drain gap 1204. The photoresist layer 1202 is thereafter stripped.

As illustrated by the cross-sectional view 1400 of FIG. 14, an erase gate dielectric layer 146 is formed covering the common memory source/drain region 128, and further lining sidewalls of the floating gate electrodes 134 and sidewalls of the control gate spacers 140 within the common source/drain gap 1204 (see FIG. 13). The erase gate dielectric layer 146 may, for example, be formed of oxide, nitride, or some other suitable dielectric(s). In some embodiments, a process for forming the erase gate dielectric layer 146 comprises high temperature oxidation (HTO), in situ steam generation (ISSG) oxidation, some other suitable deposition or growth process(es), or any combination of the foregoing. In some embodiments, the curved or bulbous surface profile on the erase gate dielectric 146 arises due to the ion implantation used to form the common source 128. The central region of the common source 128 receives a larger dose of dopants (and hence more damage) than the peripheral region of the common source, and as a result, the oxide will grow more in the central region than the peripheral region. Further, in some embodiments, the process comprises removing dielectric material that forms on portions of the memory region 104m outside the common source/drain gap 1204. The removal may, for example, comprise forming and patterning a photoresist layer 1402 covering the common memory source/drain region 128 and overhanging the control gate hard masks 210. An etchant is applied to the dielectric material to be removed with the photoresist layer 1402 in place, and the photoresist layer 1402 is subsequently removed. The patterning may, for example, be performed using photolithography.

As illustrated by the cross-sectional view 1500 of FIG. 15, a memory dielectric layer 1502 is formed covering portions of the memory region 104m on opposite sides of the floating gate electrodes 134 as the common memory source/drain region 128. The memory dielectric layer 1502 may, for example, be formed of oxide, nitride, or some other suitable dielectric(s). The memory dielectric layer 1502 may, for example, be formed by HTO, ISSG oxidation, some other suitable deposition or growth process(es), or any combination of the foregoing.

Also illustrated by the cross-sectional view 1500 of FIG. 15, a select gate layer 1504 is formed covering the memory dielectric layer 1502 and the other structure on the memory, logic, and boundary regions 104m, 104l, 104b. The select gate layer 1504 may, for example, be formed conformally, and/or may, for example, be formed of doped polysilicon, metal, or some other suitable conductive material(s). The select gate layer 1504 may, for example, be formed by CVD, PVD, or some other suitable deposition process(es).

Also illustrated by the cross-sectional view 1500 of FIG. 15, a memory antireflective coating (ARC) 1506 is formed covering the select gate layer 1504. Further, the memory ARC 1506 may, for example, be formed with a top surface that is planar or substantially planar. In some embodiments, the memory ARC 1506 can be deposited, for example via a spin-on process where the wafer is spun about its center and liquid memory ARC in the form of organic ARC is provided onto a face of the wafer. Because of its flowability, the liquid memory ARC tends to be "deeper" in lower regions of wafer's face (see 1520) and be "shallower" in higher regions of the wafer's face (see 1522), with the overall top surface of the memory ARC 1506 being generally level or planar over the entire face of the wafer. Thus, the flowability of the memory ARC 1506 tends to flatten out over underlying topography variations in the wafer's face. After the memory ARC 1506 is spun-on, a baking step can be carried out in some cases to harden the memory ARC 1506. As illustrated by the cross-sectional view 1600 of FIG. 16, an etch is performed into the select gate layer 1504 and the memory ARC 1506 (see FIG. 15) until the memory ARC 1506 is removed and a top surface of the select gate layer 1504 is about even with top surfaces of the control gate electrodes 138. The etch is performed with an etchant that has the same or substantially the same etch rate for the memory ARC 1506 as for the select gate layer 1504. As such, the memory ARC 1506 is etched back until the select gate layer 1504 is exposed. At that point, the select gate layer 1504 and the memory ARC 1506 are etched back together until the memory ARC 1506 is completely removed. The select gate layer 1504 is then etched back until the top surface of the select gate layer 1504 is about even with top surfaces of the control gate electrodes 138. Because the etch carries the flat top surface of the memory ARC (FIG. 15, flat upper surface of 1506) downward, the top surfaces of the select gate layer 1504 are level and/or substantially planar with one another. In some embodiments, after the etch, dopants are implanted into the select gate layer 1504, and an anneal is subsequently performed to activate the dopants. Notably, the etching process does not over-polish the structure, and thus does not cause "dishing" of edge memory cells relative to central memory cells of the memory array. In contrast, if CMP were performed to go from FIG. 15 to FIG. 16, the CMP could result in over polishing where a control gate, select gate, or overlying hard mask in the edge region of the memory array has a height that is less than a corresponding control gate, select gate, or overlying hard mask in the central region of the memory array.

Figure 16:
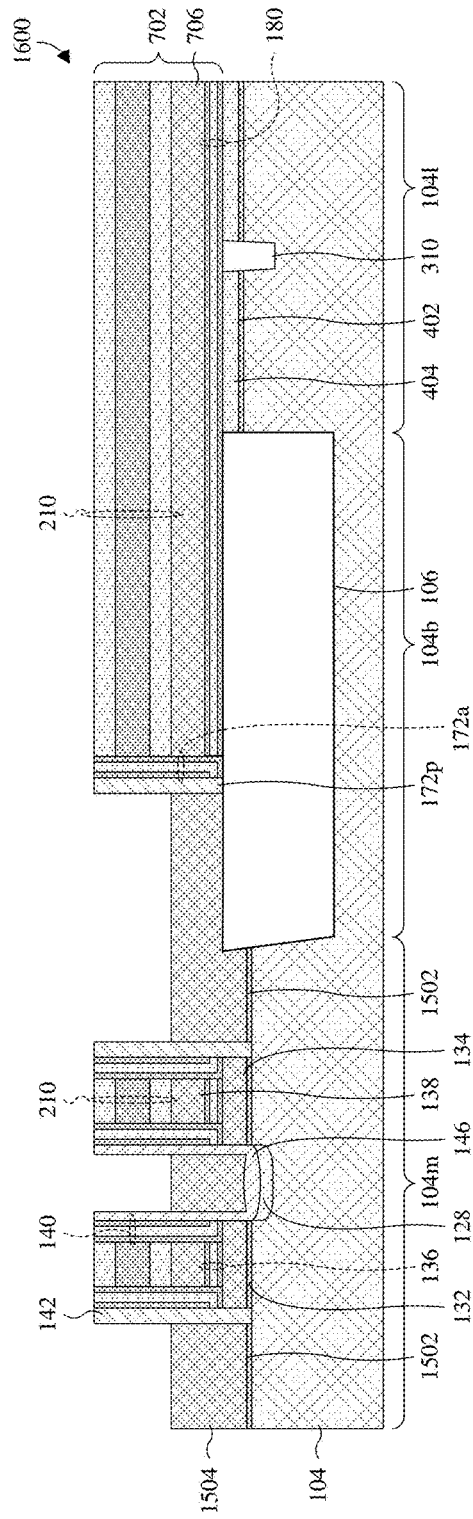
Figure 17:
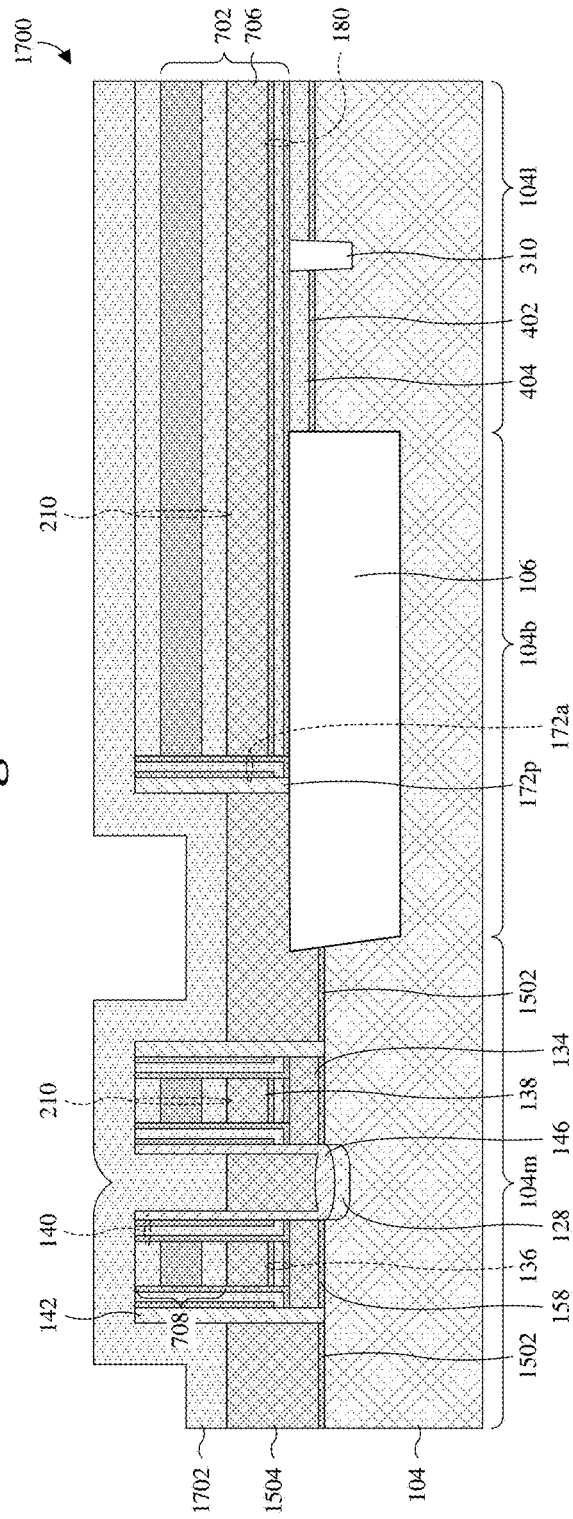

As illustrated by the cross-sectional view 1700 of FIG. 17, a memory hard mask layer 1702 is formed covering the structure of FIG. 16. The memory hard mask layer 1702 may, for example, be formed conformally, and/or may, for example, be formed of silicon nitride, silicon oxide, or some other suitable dielectric(s). Further, the memory hard mask layer 1702 may be formed by CVD, PVD, or some other suitable deposition process(es).

As illustrated by the cross-sectional view 1800 of FIG. 18, an etch is performed into the memory hard mask layer 1702 (see FIG. 17) to form a pair of select gate hard masks 152 on opposite sides of the common memory source/drain region 128. Further, the etch forms an erase gate hard mask 159 overlying the common memory source/drain region 128, and a dummy select gate hard mask 164 over the boundary isolation structure 106. In some embodiments, a process for performing the etch comprises applying one or more etchants to the memory hard mask layer 1702 until horizontal segments of the memory hard mask layer 1702 are removed. Further, in some embodiments, the etch partially removes the control gate hard masks 210 and/or the control gate hard mask layer 708.

Also illustrated by the cross-sectional view 1800 of FIG. 18, an additional etch is performed into the select gate layer 1504 (see FIG. 17) with the select gate hard masks 152, the erase gate hard mask 159, and the dummy select gate hard mask 164 in place. The second etch forms a pair of select gate electrodes 150, an erase gate electrode 144, and a dummy select gate electrode 162. The select gate electrodes 150 respectively underlie the select gate hard masks 152, the erase gate electrode 144 underlies the erase gate hard mask 159, and the dummy select gate electrode 162 underlies the dummy select gate hard mask 164.

As illustrated by the cross-sectional view 1900 of FIG. 19, a photoresist mask 1902 is formed covering the structure of FIG. 18. The photoresist mask 1902 may be deposited by, for example, spin-coating or using some other suitable deposition process(es) to form photoresist on a surface of the structure, and then selectively exposing the photoresist to light through a reticle or other photolithographic mask, and patterning using a chemical developer.

As illustrated by the cross-sectional view 2000 of FIG. 20, with developed photoresist mask 1902 in place, an etch is performed. This etch removes a control gate strap that otherwise would short control gates to one another, and also removes a common source strap that would otherwise short common sources to one another, and removes a line end of the select gates. The photomask 1902 covers the anti-dishing structure so the dummy select gate 162 and its overlying hardmask 164 remain in place. In other embodiments, the dummy select gate 162 and/or hardmask 164 can be removed and then put in place prior to CMP so the dummy select gate 162 and/or hardmask 164 can act as an anti-dishing structure. The etch may be a wet etch or a dry etch, depending on the implementation. In some embodiments, the etch proceeds to a depth, d, of approximately 700 angstroms, with the etch passing through the full thickness of approximately 260 angstroms of upper oxide layer 708*u* and through approximately 60% of the middle nitride layer 708*m* (e.g., etches to a depth of approximately 440 angstroms of the full thickness of approximately 700 angstroms of middle nitride layer 708*m*). Further, in some cases approximately 450 nm of width, w, of upper oxide layer 708*u* is left in place. Further, in some embodiments, the developed photoresist mask 1902 is removed after the etch by, for example, another etching process, ashing process, or some other suitable removal process(es).

As illustrated by the cross-sectional view 2100 of FIG. 21, a first hard mask ARC 2102 is formed covering the structure of FIG. 20. The first hard mask ARC 2102 may be deposited by, for example, CVD, PVD, or some other suitable deposition process(es).

As illustrated by the cross-sectional view 2200 of FIG. 22, the first hard mask ARC 2102 may, for example, be formed with a top surface that is planar or substantially planar. In some embodiments, a process for forming the first hard mask ARC 2102 comprises subsequently performing a planarization into the top surface of first hard mask ARC 2102 after the first hardmask ARC 2102 has been formed. The planarization may, for example, be performed by a CMP or some other suitable planarization process(es). The first hard mask ARC 2102 can then be removed by an etching process. During this planarization, the dummy hardmask 164 bolsters the structure to prevent dishing in the boundary region and/or logic region, thereby helping to improve reliability and yield. But for the dummy hardmask 164, the upper layer 708*u*, which can be made of silicon dioxide in some embodiments, is predisposed to dishing relative to the hardmasks over the memory region 104*m*. Thus, the dummy hardmask 164 limits dishing to help ward off potential issues, such as ions undesirably entering channel regions of the memory cells, and/or unwanted silicidation of the select gates 150 later on in the manufacturing flow.

As illustrated by the cross-sectional view 2300 of FIG. 23, a dummy liner layer 304 is then formed, and a first dummy capping layer 2304 is formed covering the dummy liner layer 304. In some embodiments, the dummy liner layer 304 is formed of silicon oxide or some other suitable dielectric(s). Further, in some embodiments, the first dummy capping layer 2304 is formed of polysilicon or some other suitable material(s). The dummy liner layer 304 and/or the first dummy capping layer 2304 may, for example, be formed conformally. Further, the dummy liner layer 304 and/or the first dummy capping layer 2304 may, for example, be formed by CVD, PVD, some other suitable deposition process(es), or any combination of the foregoing.

Also illustrated by the cross-sectional view 2300 of FIG. 23, a dummy ARC 2306 is formed covering the first dummy capping layer 23104. Further, the dummy ARC 2306 may, for example, be formed with a top surface that is planar or substantially planar. In some embodiments, the dummy ARC 2306 is an organic liquid that is spun on over the surface of the structure. Because of its flowability, the dummy ARC 2306 tends to be "deeper" in lower regions of wafer's face (see 2120) and be "shallower" in higher regions of the wafer's face (see 2122), with the overall top surface of the dummy ARC 2306 being generally level or planar over the entire face of the wafer. Thus, the flowability of the dummy ARC 2306 tends to flatten out over underlying topography variations in the wafer's face. After the dummy ARC 2306 is spun-on, a baking step can be carried out in some cases to harden the dummy ARC 2306.

Figure 24:
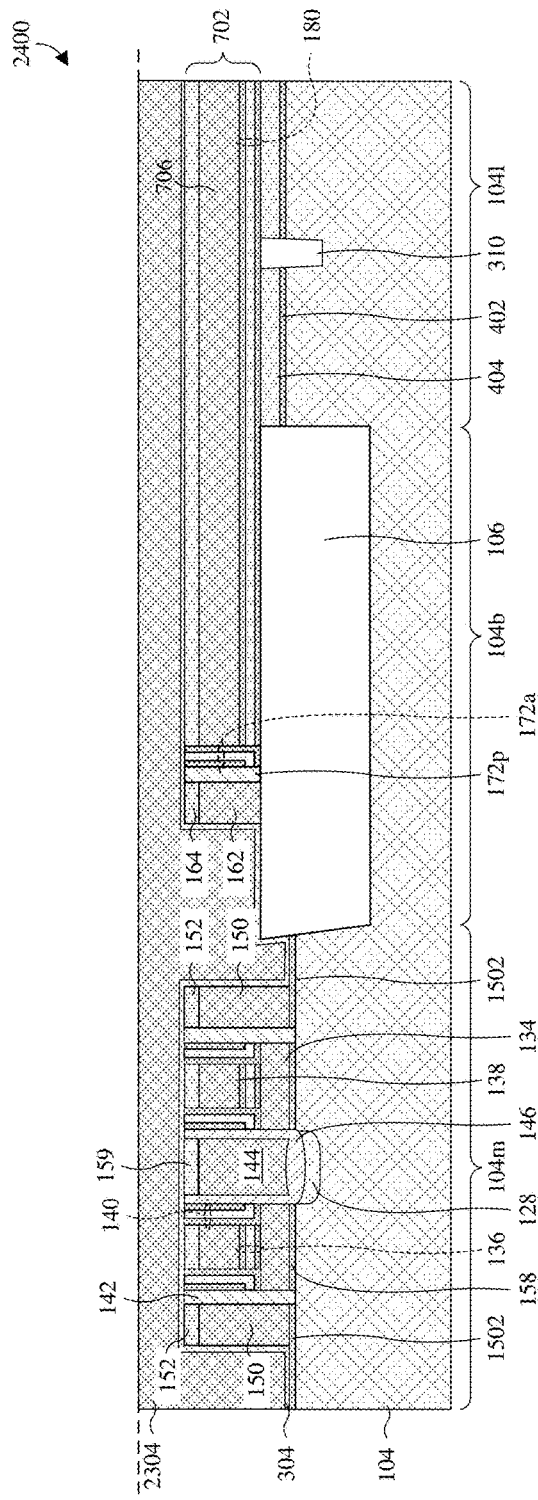

As illustrated by the cross-sectional view 2400 of FIG. 24, an etch is performed into the first dummy capping layer 2304 and the dummy ARC 2306 (see FIG. 23) until the dummy ARC 2306 is removed. The etch is performed with an etchant that has the same or substantially the same etch rate for the dummy ARC 2306 as for the first dummy capping layer 2304. As such, a top surface of the dummy ARC 2306 and a top surface of the first dummy capping layer 2304 are etched back together once the dummy ARC 2306 is sufficiently etched to expose the first dummy capping layer 2304. Further, the etch smooths, levels, or planarizes the top surface of the first dummy capping layer 2304. Notably, this etching process does not over-polish the structure, and thus does not cause "dishing" of edge memory cells relative to central memory cells of the memory array. In contrast, if CMP were performed to go from FIG. 23 to FIG. 24, the CMP could result in over polishing where a control gate, select gate, or overlying hard mask in the edge region of the memory array has a height that is less than a corresponding control gate, select gate, or overlying hard mask in the central region of the memory array.

Figure 25:
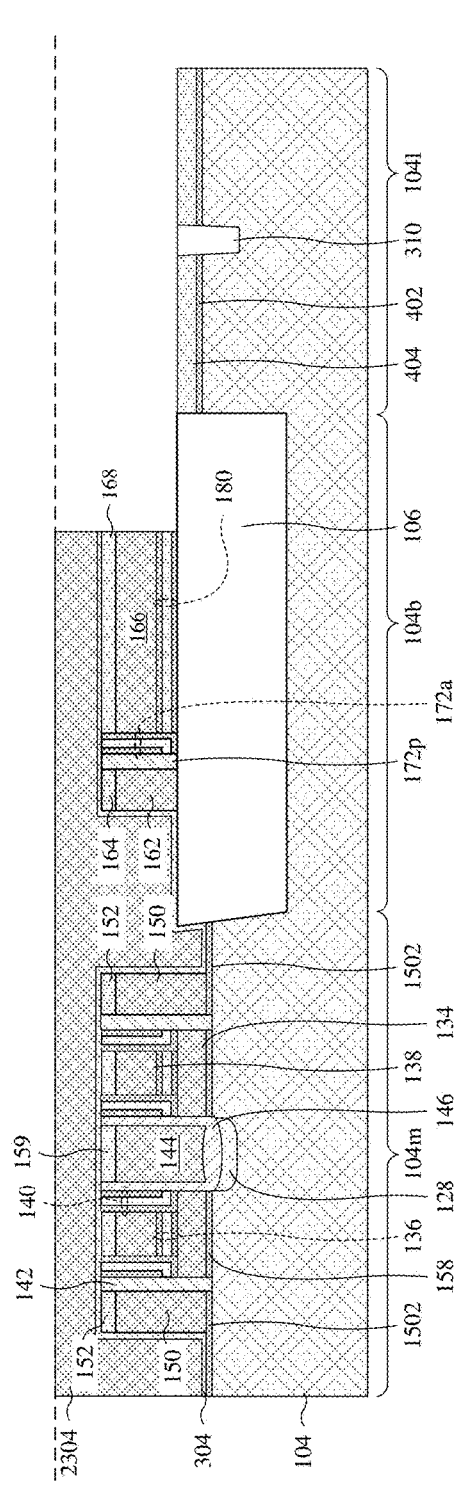

As illustrated by the cross-sectional view 2500 of FIG. 25, an etch is performed into the dummy liner layer 304, the first dummy capping layer 2304, and the multilayer memory film 702 (see FIG. 24). The etch forms a dummy control gate dielectric layer 180, a dummy control gate electrode 166 overlying the dummy control gate dielectric layer 180, and a dummy control gate hard mask 168 overlying the dummy control gate electrode 166. In some embodiments, the etch is performed by forming and patterning a photoresist layer covering the memory region 104m and part of the boundary isolation structure 106. An etchant is then applied to the dummy liner layer 304, the first dummy capping layer 2304, and the multilayer memory film 702 with the photoresist layer in place until the etchant reaches the boundary isolation structure 106, and the photoresist layer is thereafter stripped.

Figure 26:
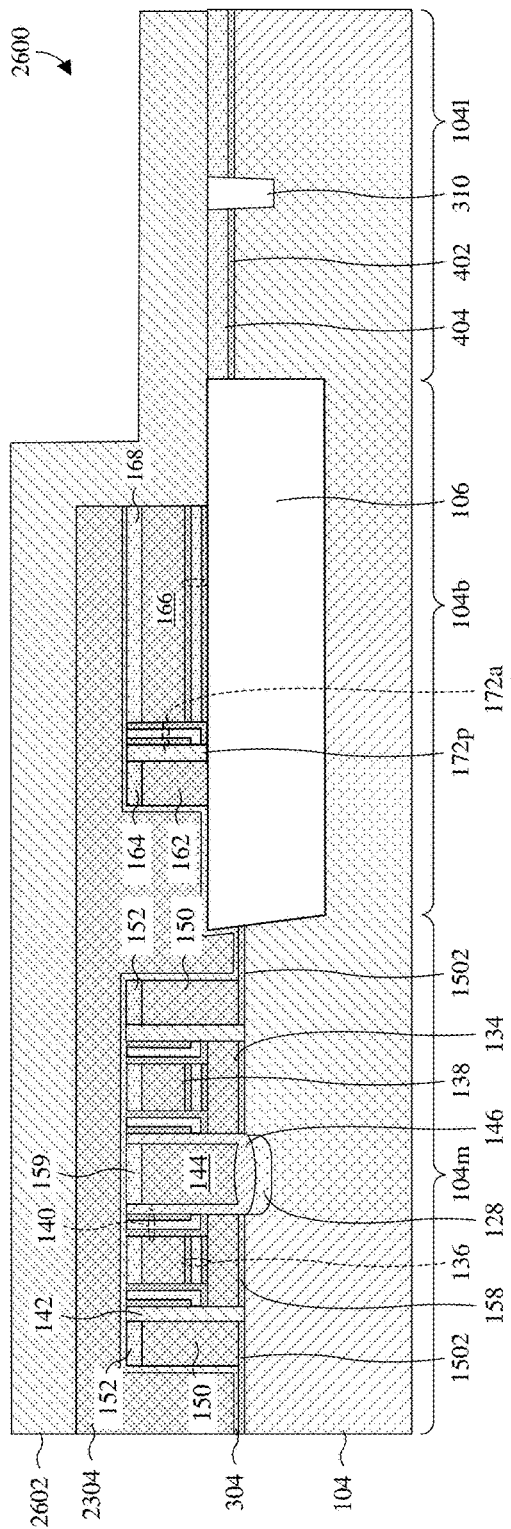

As illustrated by the cross-sectional view 2600 of FIG. 26, a boundary sidewall spacer layer 2602 is formed covering the first dummy capping layer 2304, the boundary isolation structure 106, and the logic region 104l. In some embodiments, the boundary sidewall spacer layer 2602 is formed of polysilicon, amorphous silicon, metal, a metal nitride, a dielectric, the same material as the first dummy capping layer 2304, a different material than the upper pad layer 404, or some other suitable material(s). For example, the boundary sidewall spacer layer 2602 may be formed of tungsten, aluminum copper, tantalum, tantalum nitride, or some other suitable metal(s) or metal nitride(s). As another example, the boundary sidewall spacer layer 2602 may be formed of oxide, silicon nitride, silicon oxynitride, or some other suitable dielectric(s). The boundary sidewall spacer layer 2602 may, for example, be formed conformally, and/or may, for example, be formed by CVD, PVD, some other suitable deposition process(es), or any combination of the foregoing.

Figure 27:
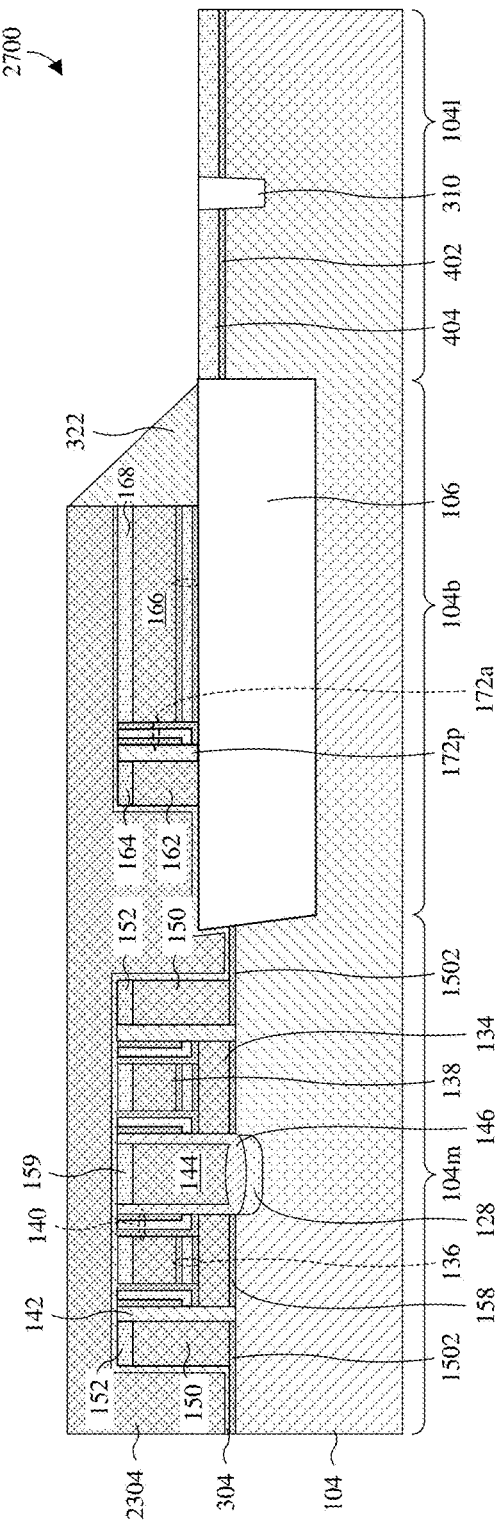

As illustrated by the cross-sectional view 2700 of FIG. 27, an etch is performed into the boundary sidewall spacer layer 2602 (see FIG. 26) to remove horizontal segments of the boundary sidewall spacer layer 2602, without removing vertical segments of the boundary sidewall spacer layer 2602, thereby forming a boundary sidewall spacer 322. In some embodiments, the boundary sidewall spacer 322 has a triangular profile or some other suitable profile. An upper surface of the boundary sidewall spacer 322 is smooth or substantially smooth, and is slanted downward towards the logic region 104l. In some embodiments, the upper surface of the boundary sidewall 322 arcs continuously from a top surface of the first dummy capping layer 2304 to a bottom surface of the boundary sidewall spacer 322. The etch may, for example, be performed by a dry etch or some other suitable etch process(es). The dry etch may, for example, use a halogen chemistry, a fluorine chemistry, some other suitable chemistry, or some other suitable chemistries. The halogen chemistry may, for example, include chlorine (e.g., $Cl_2$), hydrogen bromide (e.g., HBr), oxygen (e.g., $O_2$), argon, some other suitable halogen(s), or any combination of the foregoing. The fluorine chemistry may, for example, include tetrafluoromethane (e.g., $CF_4$), fluoroform (e.g., $CHF_3$), difluoromethane (e.g., $CH_2F_2$), sulfur hexafluoride (e.g., $SF_6$), hexafluoroethane (e.g., $C_2F_6$), hexafluoropropylene (e.g., $C_3F_6$), octafluorocyclobutane (e.g., $C_4F_8$), perfluorocyclopentene ($C_5F_8$), some other suitable fluorine(s), or any combination of the foregoing.

Figure 28:
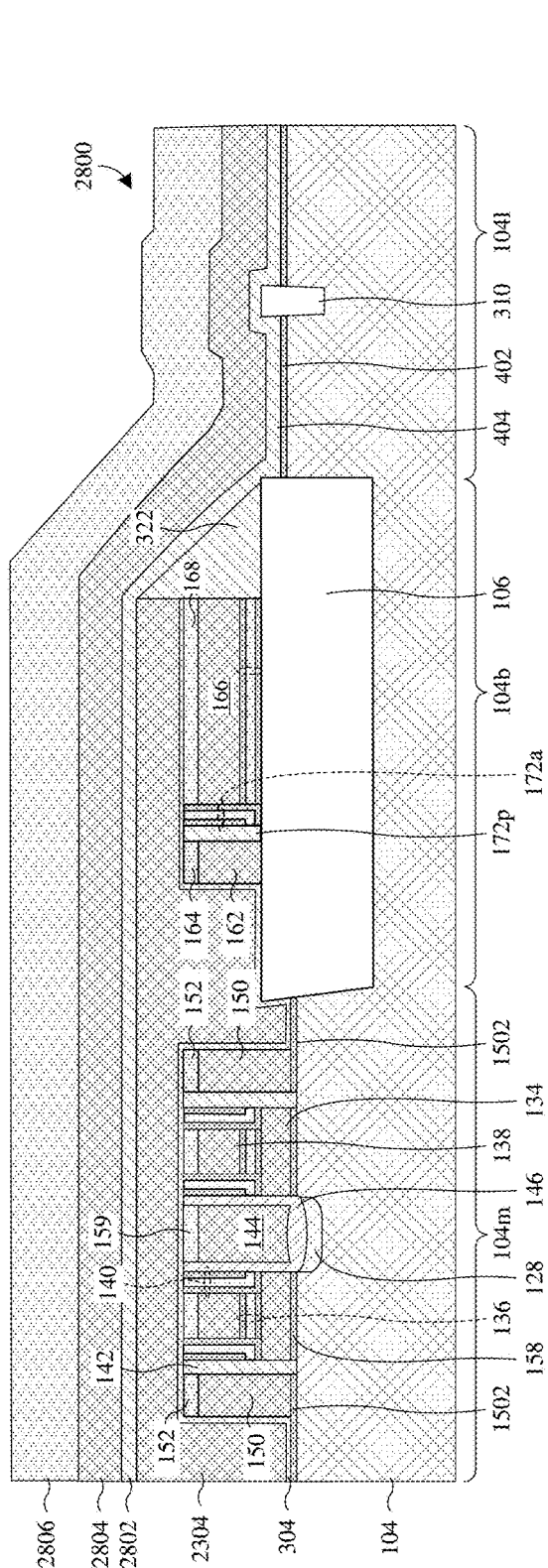

As illustrated by the cross-sectional view 2800 of FIG. 28, an etch is performed into the upper pad layer 404 (see FIG. 27) to remove the upper pad layer 404 from the logic region 104l. In some embodiments, the etch results in logic recesses with sidewalls defined by the boundary and logic isolation structures 106, 310. In some embodiments, the etch is performed with an etchant that has a high etch rate for the upper pad layer 404 and lower pad layer 402 relative to the boundary sidewall spacer 322 and the first dummy capping layer 2304, such that the boundary sidewall spacer 322 and the first dummy capping layer 2304 serve as a mask for the etch and lower pad layer 402 and upper pad layer 404 are removed.

Also illustrated by the cross-sectional view 2800 of FIG. 28, a logic dielectric layer 2802 is formed covering and lining the structure of FIG. 27. Further, a logic gate layer 2804 is formed covering the logic dielectric layer 2802, and a logic hard mask layer 2806 is formed covering the logic gate layer 2804. The logic dielectric layer 2802 may, for example, be formed of oxide, a high κ dielectric, some other suitable dielectric(s), or any combination of the foregoing. The logic gate layer 2804 may, for example, be formed of doped or undoped polysilicon, metal, some conductive material, or some other suitable material(s). The logic hard mask layer 2806 may, for example, be formed of silicon nitride, silicon oxide, some other suitable dielectric(s), or any combination of the foregoing. In some embodiments, the logic dielectric layer 2802, the logic gate layer 2804, and the logic hard mask layer 2806 are formed conformally, and/or are formed by CVD, PVD, electroless plating, electroplating, some other suitable growth or deposition process(es), or any combination of the foregoing.

Figure 29:
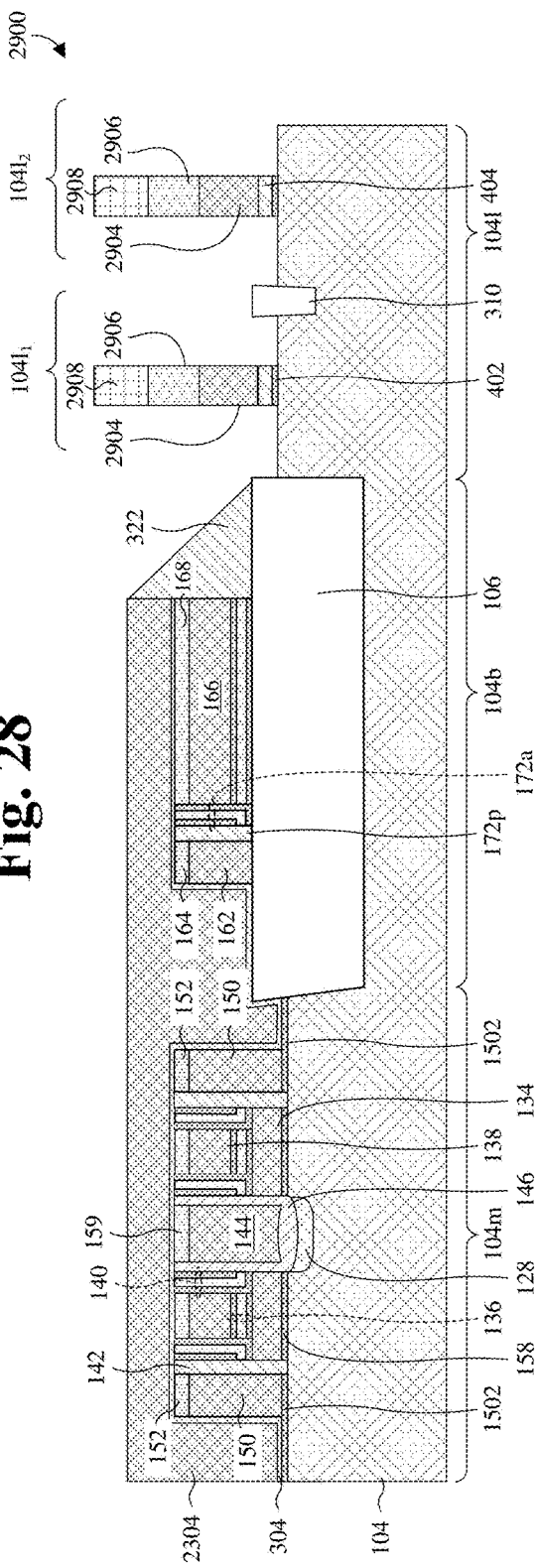

As illustrated by the cross-sectional view 2900 of FIG. 29, an etch is performed into the logic hard mask layer 2806 (see FIG. 28) and the logic gate layer 2804 (see FIG. 28) to form a pair of sacrificial logic gate electrodes 2904 and a pair of logic gate hard masks 2906. The sacrificial logic gate electrodes 2904 respectively overlie the first and second logic regions 1041l, 1041l, and the logic gate hard masks 2906 respectively overlie the sacrificial logic gate electrodes 2904. In some embodiments, the etch is performed by forming and patterning a photoresist layer 2908 covering the logic hard mask layer 2806 with a layout of the dummy logic gate hard mask 2902 and the logic gate hard masks 2906. An etchant is then applied to the logic hard mask layer 2806 and the logic gate layer 2804 with the photoresist layer 2908 in place until the etchant reaches the logic dielectric layer 2802, and the photoresist layer 2908 is thereafter stripped.

Figure 30:
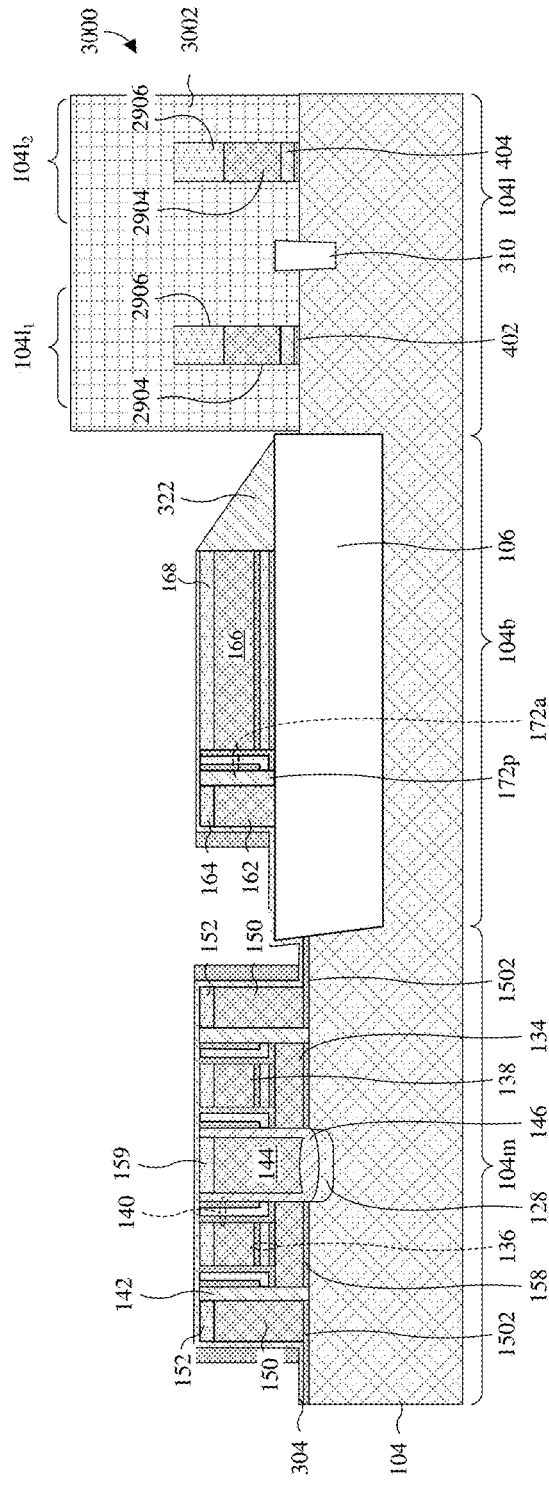

As illustrated by the cross-sectional view 3000 of FIG. 30, a photoresist layer 3002 is patterned to cover the logic region 104l, but not the memory region 104m. An etchant is then applied to the logic dielectric layer 2802 and the first dummy capping layer 2304 with the photoresist layer 3002 in place until the etchant reaches dummy liner layer 304, and the photoresist layer 3002 is thereafter stripped. The dummy liner layer 304 may, for example, serve as an etch stop for the etch.

Figure 31:
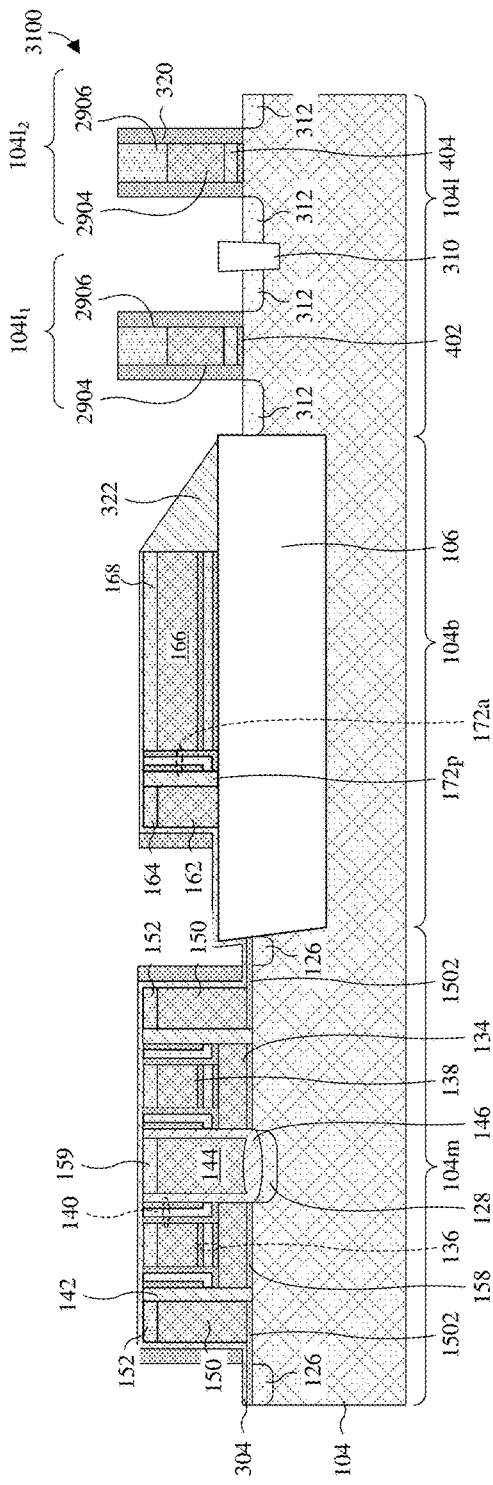

As illustrated by the cross-sectional view 3100 of FIG. 31, main sidewall spacers 320 are formed along sidewalls of the select gate electrodes 150, a sidewall of the dummy select gate electrode 162, and sidewalls of the sacrificial logic gate electrodes 2904. For ease of illustration, only some of the main sidewall spacers 320 are labeled 320. In some embodiments, the main sidewall spacers 320 each comprise silicon oxide, silicon nitride, some other suitable dielectric(s), or any combination of the foregoing. Further, in some embodiments, a process for forming the main sidewall spacers 320 comprises depositing a main sidewall spacer layer covering and lining the structure of FIG. 30. An etch back is then performed into the main sidewall spacer layer to remove horizontal segments of the main sidewall spacer layer without removing vertical segments of the main sidewall spacer layer. The main sidewall spacer layer may, for example, be deposited conformally, and/or may, for example, be formed by CVD, PVD, some other suitable deposition process(es), or any combination of the foregoing.

Also illustrated by the cross-sectional view 3100 of FIG. 31, individual memory source/drain regions 126 are formed in the memory region 104m, respectively bordering the select gate electrodes 150. Further, logic source/drain regions 312 are formed in pairs in the logic region 104l, with the source/drain regions of each pair respectively bordering opposite sidewalls of a sacrificial logic gate electrode 2904. In some embodiments, a process for forming the individual memory source/drain regions 126 and the logic source/drain regions 312 comprises ion implantation into the semiconductor substrate 104. Dopants and/or implant energy may, for example, be selected so as to perform the ion implantation through the dummy liner layer 304, the memory dielectric layer 1502, the logic dielectric layer 2602, and the lower pad layer 402. In other embodiments, some process other than ion implantation is used to form the individual memory source/drain regions 126 and the logic source/drain regions 312.

Figure 32:
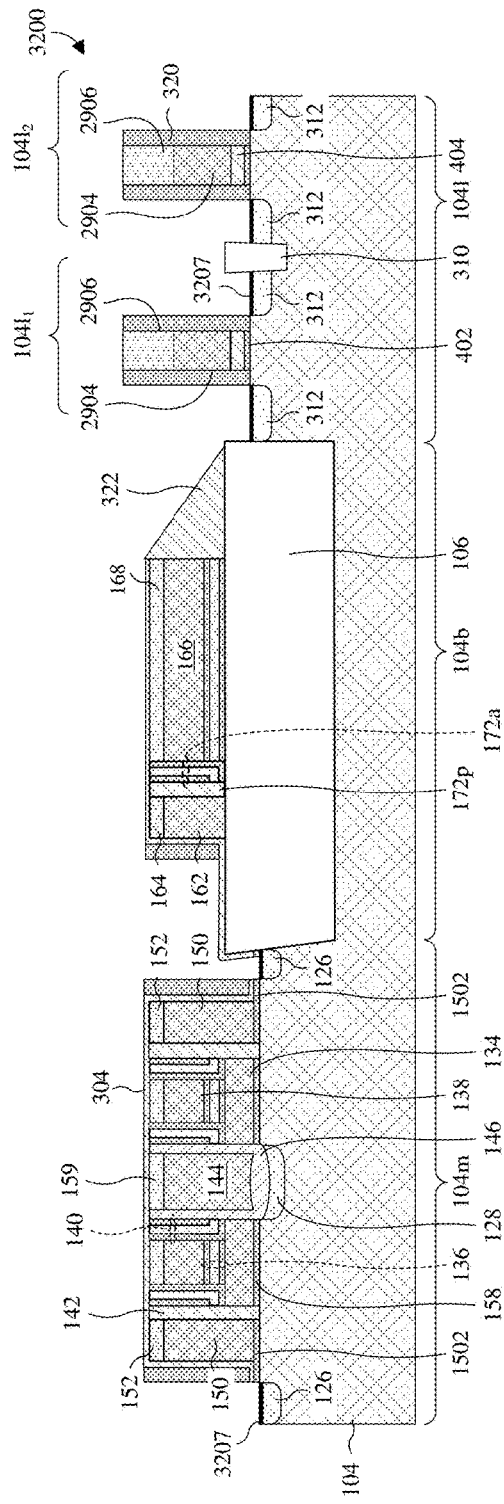

As illustrated by the cross-sectional view 3200 of FIG. 32, an etch to remove several layers from the individual memory source/drain regions 126 and the logic source/drain regions 312, thereby exposing the individual memory source/drain regions 126 and the logic source/drain regions 312. In some embodiments, a process for performing the etch comprises applying an etchant to the dummy liner layer 304 and the memory dielectric layer 1502, and thereafter applying a cleaning solution or mixture to remove residual etch residue. The cleaning solution or mixture may be or otherwise comprise, for example, a sulfuric acid hydrogen peroxide mixture (SPM) or some other suitable cleaning solution(s) or mixture(s). Further, in some embodiments, the etch is performed using, inter alia, the select and control gate hard masks 152, 154, the logic gate hard masks 2906, and the first dummy capping layer 2304 as a mask.

Also illustrated by the cross-sectional view 3200 of FIG. 32, silicide pads 3207 are formed on the individual memory source/drain regions 126 and the logic source/drain regions 312. The silicide pads may be or otherwise comprise, for example, nickel silicide or some other suitable silicide(s), and/or may, for example, be formed by a salicide process, or some other suitable growth process(es).

Figure 33:
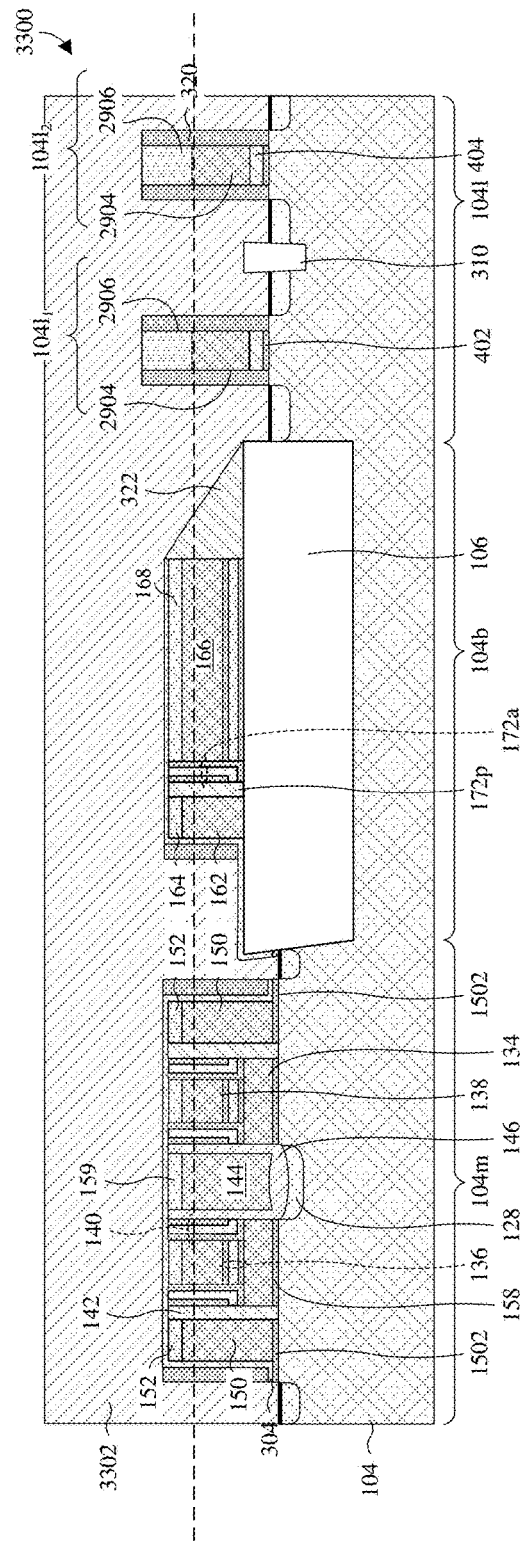

As illustrated by the cross-sectional view 3300 of FIG. 33, a second hard mask ARC 3302 is formed covering the structure of FIG. 32. Further, the second hard mask ARC 3302 may, for example, be formed with a top surface that is planar or substantially planar. In some embodiments, a process for forming the second hard mask ARC 3302 comprises an organic ARC that is spun-on over the illustrated structure.

Figure 34:
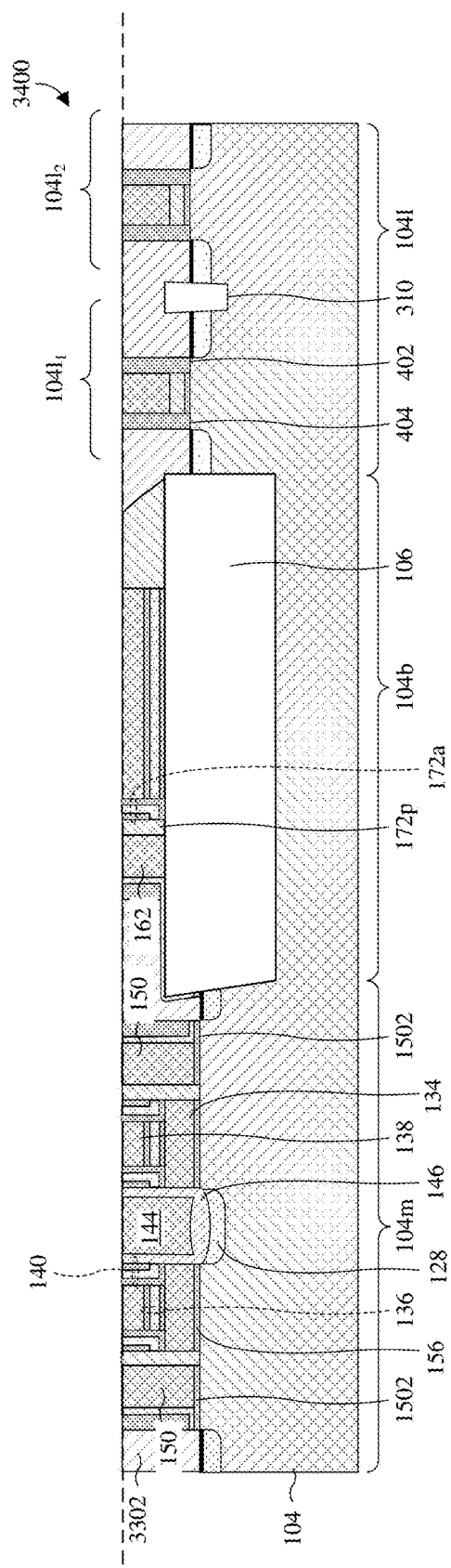

As illustrated by the cross-sectional view 3400 of FIG. 34, an etch is performed to remove the hard masks and the first dummy capping layer 2304. In some embodiments, the etch is performed with an etchant that has the same or substantially the same etch rate for the second hard mask ARC 3302 as for the hard masks and the first dummy capping layer 2304. As such, the top surface of the second hard mask ARC 3302, the top surface of the first dummy capping layer 2304, and the top surfaces of the hard masks are etched back together once the second hard mask ARC 3302 is sufficiently etched to expose the hard masks and the first dummy capping layer 2304. This etching process does not over-polish the structure, and thus does not cause "dishing" of edge memory cells relative to central memory cells of the memory array. In some embodiments, the etch is a dry etch that includes $CH_2F_2$, $CHF_3$, and/or He etchants. In contrast, if CMP were performed to go from FIG. 33 to FIG. 34, the CMP could result in over polishing where a control gate, select gate, or overlying hard mask in the edge region of the memory array has a height that is less than a corresponding control gate, select gate, or overlying hard mask in the central region of the memory array.

Figure 35:
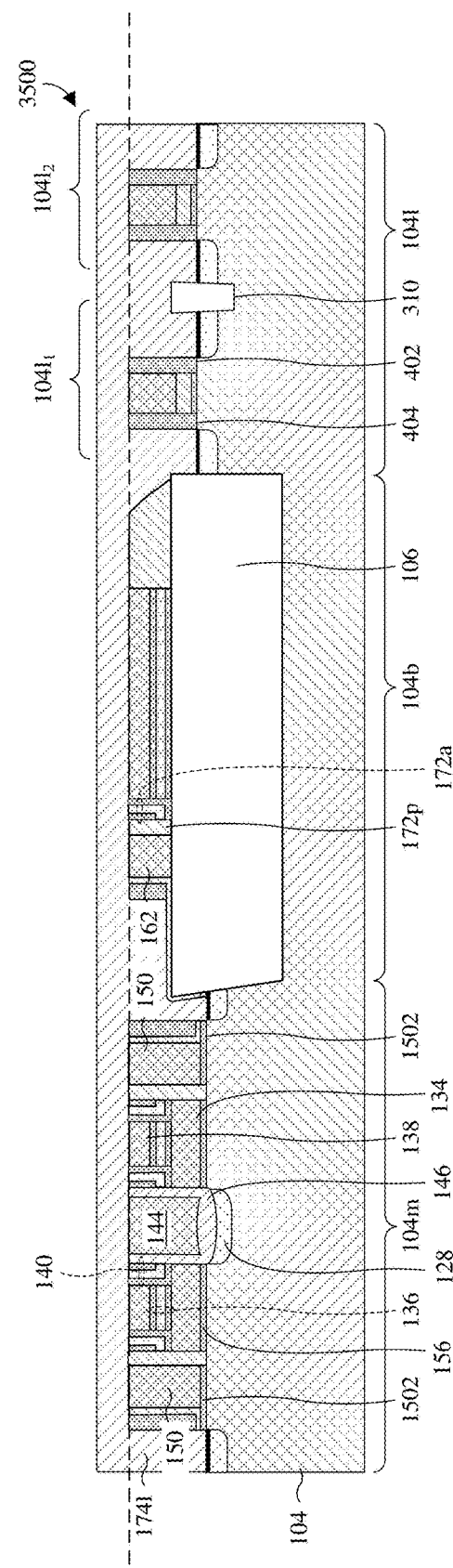

As illustrated by the cross-sectional view 3500 of FIG. 35, the second hard mask ARC 3302 (see FIG. 34) is removed, and thereafter a lower ILD layer 1741 is formed in place of the second hard mask ARC 3302. Further, the lower ILD layer 1741 is formed covering the structure of FIG. 34 and, in some embodiments, with a top surface that is planar or substantially planar. The lower ILD layer 1741 may, for example, be oxide, a low κ dielectric, some other suitable dielectric(s), or any combination of the foregoing. The second hard mask ARC 3302 may, for example, be removed by an etching process or some other suitable removal process(es). In some embodiments, a process for forming the lower ILD layer 1741 comprises depositing the lower ILD layer 1741, and subsequently performing a planarization into the top surface of the lower ILD layer 1741. The lower ILD layer 1741 may, for example, be deposited by CVD, PVD, sputtering, or any combination of the foregoing. The planarization may, for example, be performed by a CMP or some other suitable planarization process(es).

Figure 36:
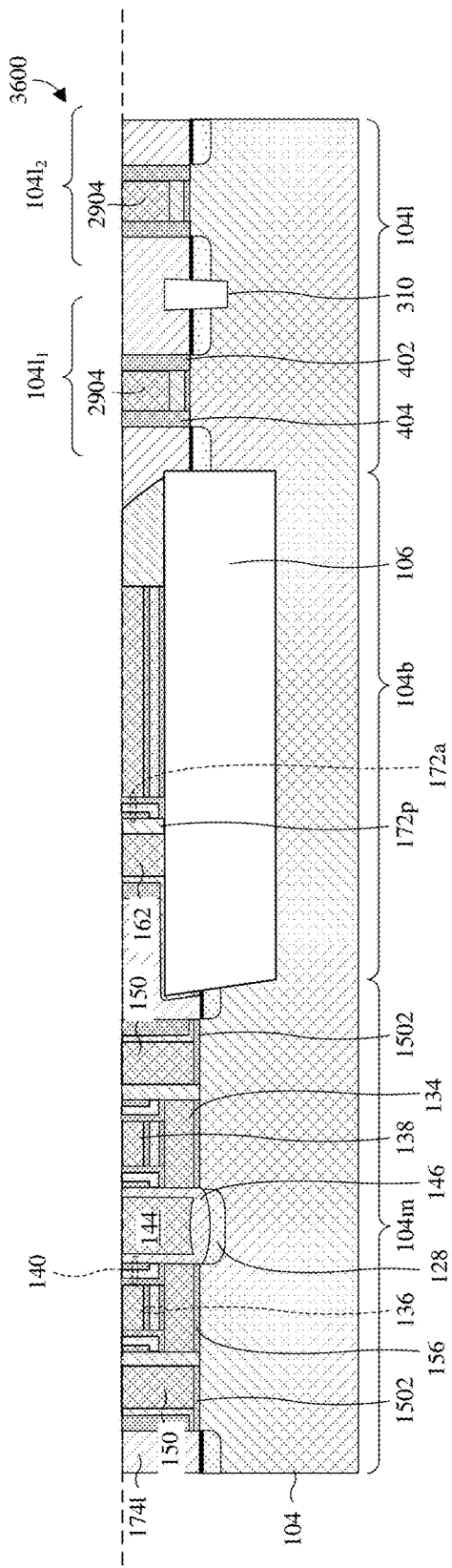

As illustrated by the cross-sectional view 3600 of FIG. 36, a planarization is performed into the lower ILD layer 174l to recess a top surface of the lower ILD layer 174l to about even with top surfaces of the sacrificial logic gate electrodes 2904, thereby exposing the sacrificial logic gate electrodes 2904. The planarization may, for example, be performed by a CMP or some other suitable planarization process(es).

Figure 37:
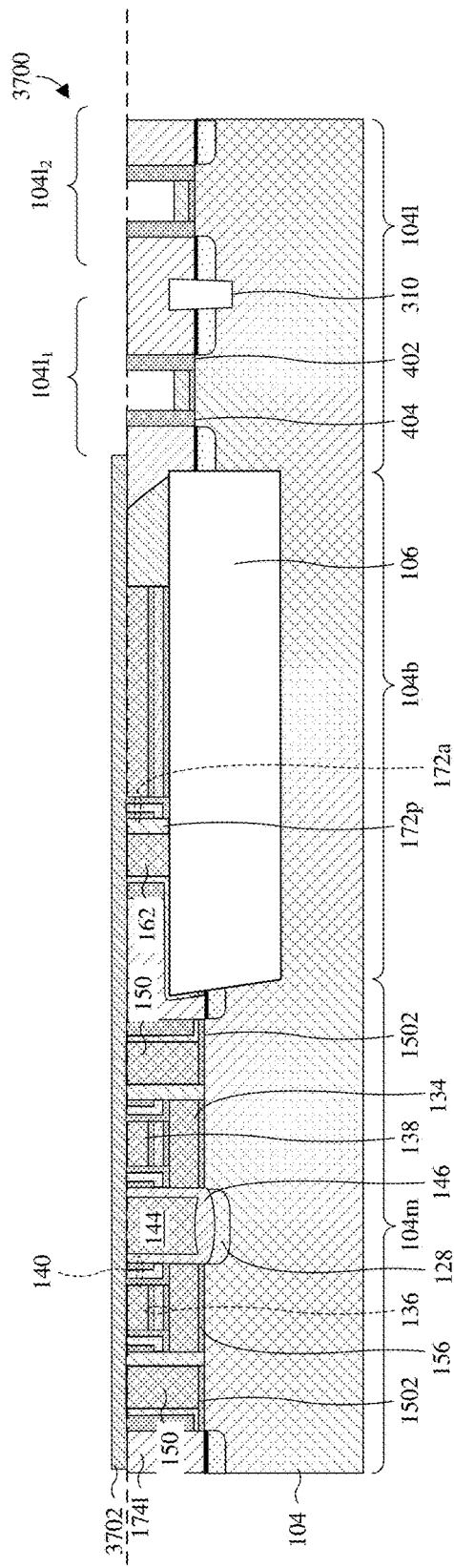

As illustrated by the cross-sectional view 3700 of FIG. 37, a second dummy capping layer 3702 is formed covering the memory region 104m and the boundary isolation structure 106, but not the logic region 104l. The second dummy capping layer 3702 may, for example, be oxide, nitride, some other suitable dielectric(s), or any combination of the foregoing. In some embodiments, a process for forming the second dummy capping layer 3702 comprises depositing the second dummy capping layer 3702 by CVD, PVD, or some other suitable deposition process(es), and subsequently patterning the second dummy capping layer 3702 layer by, for example, photolithography and an etching process, or by some other suitable patterning process(es).

Also illustrated by the cross-sectional view 3700 of FIG. 37, an etch is performed into the sacrificial logic gate electrodes 2904 (see FIG. 36) to remove the sacrificial logic gate electrodes 2904 and to define logic openings in place of the sacrificial logic gate electrodes 2904. In some embodiments, a process for performing the etch comprises applying an etchant to the sacrificial logic gate electrodes 2904 with the second dummy capping layer 3702 in place until the sacrificial logic gate electrodes 2904 are removed. The second dummy capping layer 3702 and other dielectric structure (e.g., the lower ILD layer 174l) may serve as a mask while the etchant is being applied.

Figure 38:
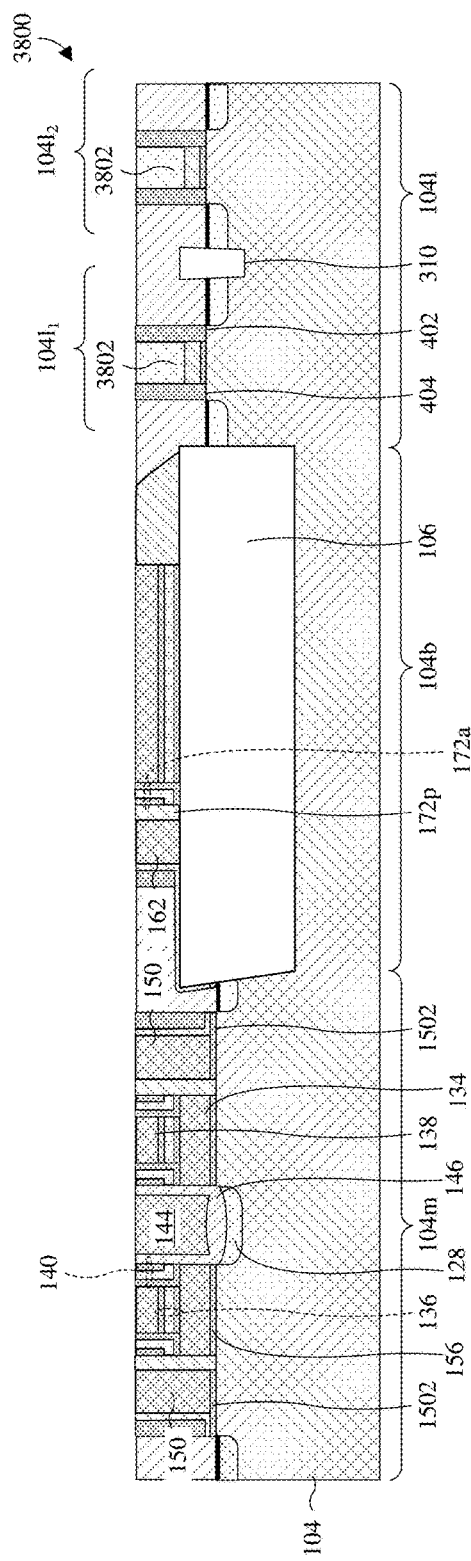

As illustrated by the cross-sectional view 3800 of FIG. 38, logic gate electrodes 3802 are formed in the logic openings. The logic gate electrodes 38023802 may, for example, be metal, doped polysilicon, a different material than the sacrificial logic gate electrodes 2904, or some other suitable conductive material(s). In some embodiments, a process for forming the logic gate electrodes 38023802 comprises forming a conductive layer covering the second dummy capping layer 3702 (see FIG. 37), and further filling the logic openings. The conductive layer may be formed by, for example, by CVD, PVD, electroless plating, electroplating, or some other suitable growth or deposition process(es). A planarization is then performed into the conductive layer and the second dummy capping layer 3702 until the lower ILD layer 174l is reached and second dummy capping layer 3702 is removed. The planarization may, for example, be performed by a CMP or some other suitable planarization process(es).

Figure 39:
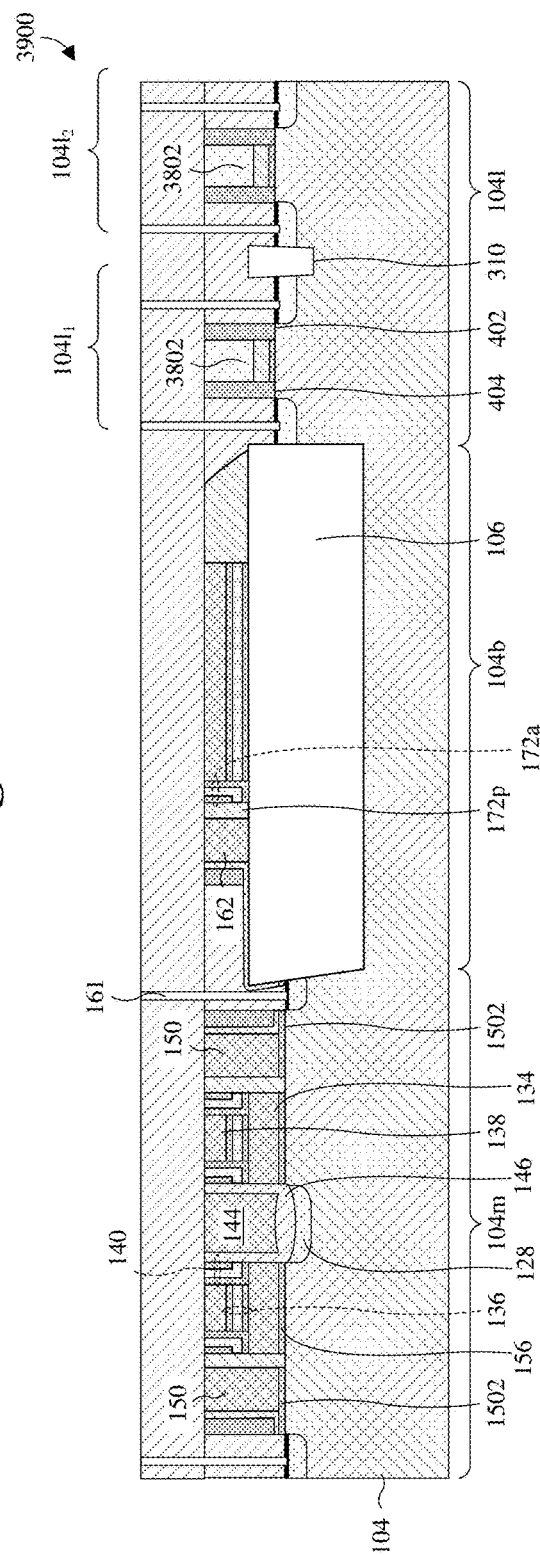

As illustrated by the cross-sectional view 3900 of FIG. 39, an upper ILD layer 174u is formed covering the structure of FIG. 38 and with a top surface that is planar or substantially planar. The upper ILD layer 174u may, for example, be oxide, a low κ dielectric, some other suitable dielectric(s), or any combination of the foregoing. Further, the upper ILD layer 174u may, for example, be formed depositing the upper ILD layer 174u, and subsequently performing a planarization into the top surface of the upper ILD layer 174u. The deposition may, for example, be performed by CVD, PVD, sputtering, or any combination of the foregoing. The planarization may, for example, be performed by a CMP or some other suitable planarization process(es).

Also illustrated by the cross-sectional view 3900 of FIG. 39, contacts 161 are formed extending through the upper ILD layer 174u and the lower ILD layer 174l to the individual memory source/drain regions 126, the logic source/drain regions 312, the common memory source/drain region 128, the control gate electrodes 138, the select gate electrodes 150, the erase gate electrode 144, the logic gate electrodes 3802, or any combination of the foregoing.

Figure 40:
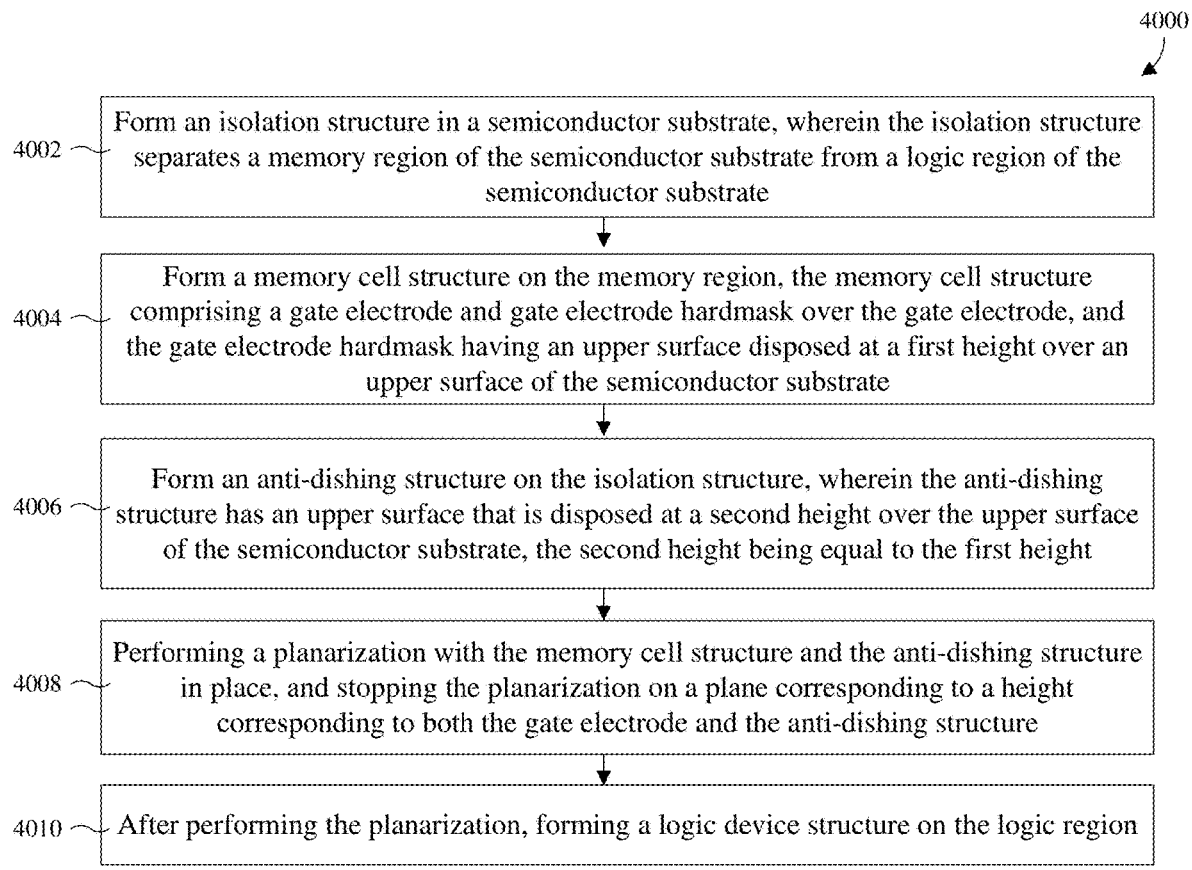
FIG. 40 illustrates a flowchart of some embodiments of the method of FIGS. 4-39.

With reference to FIG. 40, a flowchart 4000 of some embodiments of a method for forming an IC comprising an embedded memory boundary structure with a boundary sidewall spacer is provided. The IC may, for example, correspond to the IC of FIGS. 4-39.

At 4002, a substrate is provided. The substrate comprises a boundary isolation structure separating a memory region of the substrate from a logic region of the substrate. See, for example, FIGS. 4-6.

At 4004, a memory cell structure is formed on the memory region. The memory cell structure includes a gate electrode and gate electrode hardmask over the gate electrode. The gate electrode hardmask has an upper surface disposed at a first height over an upper surface of the semiconductor substrate. See, for example, FIGS. 7-19.

At 4006, an anti-dishing structure is formed on the isolation structure. The anti-dishing structure has an upper surface that is disposed at a second height over the upper surface of the semiconductor substrate. The second height is equal to the first height. See, for example, FIGS. 15-19.

At 4008, a planarization is performed with the memory cell structure and the anti-dishing structure in place. The planarization stops on a plane corresponding to a height corresponding to both the gate electrode and the anti-dishing structure. See, for example, FIGS. 15-19.

At 4010, after performing the planarization, a logic device structure is formed on the logic region. See, for example, FIGS. 23-39.

While the flowchart 4000 of FIG. 40 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards an integrated circuit (IC). The integrated circuit includes a semiconductor substrate having a logic region and a memory cell region separated by an isolation structure. The isolation structure extends into a top surface of the semiconductor substrate and comprises dielectric material. A logic device is arranged on the logic region. A memory device is arranged on the memory region. The memory device includes a gate electrode and a memory hardmask over the gate electrode. An anti-dishing structure is disposed on the isolation structure. An upper surface of the anti-dishing structure and an upper surface of the memory hardmask have equal heights as measured from the top surface of the semiconductor substrate.

A method for forming an integrated circuit (IC), the method comprising: forming an isolation structure in a semiconductor substrate, wherein the isolation structure separates a memory region of the semiconductor substrate from a logic region of the semiconductor substrate; forming a memory cell structure on the memory region, the memory cell structure comprising a gate electrode and gate electrode hardmask over the gate electrode, and the gate electrode hardmask having an upper surface disposed at a first height over an upper surface of the semiconductor substrate; forming an anti-dishing structure on the isolation structure, wherein the anti-dishing structure has an upper surface that is disposed at a second height over the upper surface of the semiconductor substrate, the second height being equal to the first height; performing a planarization with the memory cell structure and the anti-dishing structure in place and stopping the planarization on a plane corresponding to a height corresponding to both the gate electrode and the anti-dishing structure; and after performing the planarization, forming a logic device structure on the logic region.

Still other embodiments relate to an integrated circuit (IC). The IC includes a semiconductor substrate having a peripheral region and a memory cell region separated by an isolation structure. The isolation structure extends into a top surface of the semiconductor substrate and comprises dielectric material. A logic device is disposed on the peripheral region, and a memory device is disposed on the memory region. The memory device includes a gate electrode and a memory hardmask over the gate electrode. An anti-dishing structure is disposed on the isolation structure. An upper surface of the anti-dishing structure and an upper surface of the memory hardmask are co-planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a semiconductor substrate including a logic region and a memory cell region separated by an isolation structure, wherein the isolation structure extends into a top surface of the semiconductor substrate and comprises dielectric material;
   a logic device on the logic region, wherein the logic device includes a conductive logic gate electrode;
   a memory device on the memory cell region, wherein the memory device includes a first select gate electrode;
   a dummy select gate structure made of conductive material disposed on the isolation structure, wherein an upper surface of the dummy select gate structure and an upper surface of the first select gate electrode have equal heights as measured from the top surface of the semiconductor substrate;
   wherein an upper surface of the conductive logic gate electrode has a second height as measured from the top surface of the semiconductor substrate, the second height being less than each of the equal heights;
   a dummy control gate structure disposed on the isolation structure, wherein the dummy control gate structure has an inner sidewall facing the memory cell region; and
   a sidewall spacer along the inner sidewall of the dummy control gate structure and disposed on the isolation structure, wherein the sidewall spacer has an inner sidewall facing the memory cell region; and
   wherein the dummy select gate structure is disposed along the inner sidewall of the sidewall spacer and disposed on the isolation structure.

2. The IC of claim 1, further comprising:
   a select gate hardmask over the first select gate electrode;
   a dummy hardmask over the dummy select gate structure; and
   wherein an upper surface of the select gate hardmask and an upper surface of the dummy hardmask have equal heights as measured from the top surface of the semiconductor substrate.

3. The IC of claim 2, further comprising:
   a dielectric layer over the isolation structure, the dielectric layer comprising an uppermost surface and a recessed upper surface, the uppermost surface being level with the upper surface of the select gate hardmask and the recessed upper surface being below the uppermost surface; and
   an inter-layer dielectric (ILD) layer disposed over the recessed upper surface and having an upper surface that is level with the uppermost surface of the dielectric layer.

4. The IC according to claim 1, wherein the sidewall spacer comprises:
   an outer oxide layer along the inner sidewall of the dummy control gate structure;
   a nitride layer along an inner sidewall of the outer oxide layer; and
   an inner oxide layer along an inner sidewall of the nitride layer, the inner oxide layer having an inner sidewall that contacts an outer sidewall of the dummy select gate structure.

5. The IC according to claim 2, wherein the memory device comprises:
   first and second individual source/drain regions in the semiconductor substrate;
   a common source/drain region in the semiconductor substrate, laterally spaced between the first and second individual source/drain regions, wherein the common source/drain region is separated from the first individual source/drain region by a first channel region, and wherein the common source/drain region is separated from the second individual source/drain region by a second channel region;
   an erase gate electrode over the common source/drain region;
   first and second floating gate electrodes respectively over the first and second channel regions;
   first and second control gate electrodes respectively overlying the first and second floating gate electrodes; and
   the first select gate electrode and a second select gate electrode respectively on the first and second channel regions, and laterally spaced from the common source/drain region respectively by the first and second floating gate electrodes.

6. The IC according to claim 5, further comprising:
   a control gate hardmask over the first control gate electrode; and
   wherein an upper surface of the control gate hardmask and an upper surface of the dummy hardmask have equal heights as measured from the top surface of the semiconductor substrate.

7. The IC of claim 5, further comprising:
   a liner layer extending along outer sidewalls of the first and second select gate electrodes; and additional outermost sidewall spacers disposed along outer sidewalls of the liner layer, wherein outer sidewalls of the additional outermost sidewall spacers are substantially aligned to inner edges of the first and second individual source/drain regions.

8. An integrated circuit (IC), comprising:
a memory device, comprising:
first and second individual source/drain regions disposed in a semiconductor substrate;
a common source/drain region in the semiconductor substrate, laterally spaced between the first and second individual source/drain regions, wherein the common source/drain region is separated from the first individual source/drain region by a first channel region, and wherein the common source/drain region is separated from the second individual source/drain region by a second channel region;
an erase gate electrode over the common source/drain region;
first and second floating gate electrodes respectively over the first and second channel regions;
first and second control gate electrodes respectively overlying the first and second floating gate electrodes; and
a first select gate electrode and a second select gate electrode respectively over the first and second channel regions, and laterally spaced from the common source/drain region respectively by the first and second floating gate electrodes;
an isolation structure extending into a top surface of the semiconductor substrate and laterally separating the memory device from a logic device, the isolation structure comprising dielectric material and having an uppermost surface and a slanted upper surface extending from the uppermost surface to an edge of the isolation structure proximate to the first and second select gate electrodes; and
a dummy select gate structure made of conductive material disposed on the uppermost surface of the isolation structure, wherein an upper surface of the dummy select gate structure and an upper surface of the first select gate electrode have equal heights as measured from the top surface of the semiconductor substrate.

9. The IC of claim 8, further comprising:
a select gate hardmask over the first select gate electrode;
a dummy hardmask over the dummy select gate structure; and
wherein an upper surface of the select gate hardmask and an upper surface of the dummy hardmask have equal heights as measured from the top surface of the semiconductor substrate.

10. The IC according to claim 8, further comprising:
a control gate hardmask over the first control gate electrode;
a dummy hardmask over the dummy select gate structure; and
wherein an upper surface of the control gate hardmask and an upper surface of the dummy hardmask have equal heights as measured from the top surface of the semiconductor substrate.

11. The IC of claim 8, wherein the dielectric material of the isolation structure is continuous between a bottom surface of the isolation structure and a top surface of the isolation structure.

12. The IC of claim 11, wherein the top surface of the isolation structure is raised relative to the top surface of the semiconductor substrate.

13. The IC of claim 8, further comprising:
a dummy control gate structure disposed on the isolation structure, wherein the dummy control gate structure has an inner sidewall facing the memory device;
an innermost sidewall spacer along the inner sidewall of the dummy control gate structure and disposed on the isolation structure, wherein the innermost sidewall spacer has an inner sidewall facing the memory device; and
wherein the dummy select gate structure is disposed along the inner sidewall of the innermost sidewall spacer and disposed on the isolation structure.

14. The IC according to claim 13, wherein the innermost sidewall spacer comprises:
an outer dielectric layer along the inner sidewall of the dummy control gate structure;
a nitride layer along an inner sidewall of the outer dielectric layer; and
an inner dielectric layer along an inner sidewall of the nitride layer, the inner dielectric layer having an inner sidewall that contacts an outer sidewall of the dummy select gate structure.

15. The IC according to claim 13, further comprising:
a boundary spacer along an outer sidewall of the dummy control gate structure, where the boundary spacer has a cross-section that is generally triangular.

16. An integrated circuit (IC) comprising:
a semiconductor substrate including a logic region and a memory cell region separated by an isolation structure, wherein the isolation structure extends into a top surface of the semiconductor substrate and comprises dielectric material;
a logic device on the logic region;
a memory device on the memory cell region, wherein the memory device includes a first select gate electrode and a first floating gate electrode that are laterally spaced apart from one another over the top surface of the semiconductor substrate, wherein the first select gate electrode and the first floating gate electrode are disposed between a common source/drain region and a first individual source/drain region that are disposed in the semiconductor substrate;
a dummy select gate structure disposed on an uppermost surface of the isolation structure, wherein the dummy select gate structure is made of the same material as the first select gate electrode and wherein an upper surface of the dummy select gate structure and an upper surface of the first select gate electrode have equal heights as measured from the top surface of the semiconductor substrate;
a dummy control gate structure disposed on the isolation structure, wherein the dummy control gate structure has an inner sidewall facing the memory cell region;
a sidewall spacer along the inner sidewall of the dummy control gate structure and disposed on the isolation structure, wherein the sidewall spacer has an inner sidewall facing the memory cell region; and
a boundary spacer along an outer sidewall of the dummy control gate structure, where the boundary spacer has an outer sidewall that is angled at an angle of other than ninety degrees relative to a plane corresponding to the top surface of the semiconductor substrate;
wherein the dummy select gate structure is disposed along the inner sidewall of the sidewall spacer and disposed on the isolation structure.

17. The IC according to claim 16, wherein the sidewall spacer comprises:

an outer dielectric layer along the inner sidewall of the dummy control gate structure;

a nitride layer along an inner sidewall of the outer dielectric layer; and an inner dielectric layer along an inner sidewall of the nitride layer, the inner dielectric layer having an inner sidewall that contacts an outer sidewall of the dummy select gate structure.

18. The IC of claim 16, wherein the dummy select gate structure includes a lower surface on the uppermost surface of the isolation structure, and the lower surface of the dummy select gate structure is higher than a lower surface of the first select gate electrode.

19. The IC of claim 16, where the boundary spacer has a cross-section that is generally triangular.

20. The IC of claim 16, wherein the angle ranges between about 70-80 degrees, about 50-80 degrees, or about 60-70 degrees.

* * * * *